(12) United States Patent
Tam

(10) Patent No.: US 9,703,702 B2
(45) Date of Patent: Jul. 11, 2017

(54) ADDRESSING AUTO ADDRESS ASSIGNMENT AND AUTO-ROUTING IN NAND MEMORY NETWORK

(71) Applicant: SanDisk Technologies LLC, Plano, TX (US)

(72) Inventor: Eugene Jinglun Tam, Saratoga, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 107 days.

(21) Appl. No.: 14/139,164

(22) Filed: Dec. 23, 2013

(65) Prior Publication Data

US 2015/0178197 A1     Jun. 25, 2015

(51) Int. Cl.
| | |
|---|---|
| G06F 12/08 | (2016.01) |
| G11C 5/00 | (2006.01) |
| G11C 29/00 | (2006.01) |
| G11C 8/12 | (2006.01) |

(52) U.S. Cl.
CPC ............ *G06F 12/08* (2013.01); *G11C 5/00* (2013.01); *G11C 8/12* (2013.01); *G11C 29/83* (2013.01); *G11C 29/88* (2013.01); *G06F 2212/1016* (2013.01); *G06F 2212/2022* (2013.01)

(58) Field of Classification Search
USPC .............................................. 365/68, 185.11
See application file for complete search history.

(56) References Cited

U.S. PATENT DOCUMENTS

| | | | |
|---|---|---|---|
| 5,070,032 A | 12/1991 | Yuan et al. | |
| 5,903,495 A | 5/1999 | Takeuchi et al. | |
| 5,924,128 A * | 7/1999 | Luick ...................... | G06F 9/355 |
| | | | 711/220 |
| 6,046,935 A | 4/2000 | Takeuchi et al. | |
| 6,378,018 B1 | 4/2002 | Tsern | |
| 6,745,337 B1 * | 6/2004 | Trivedi ............... | G06F 13/4072 |
| | | | 713/400 |

(Continued)

FOREIGN PATENT DOCUMENTS

| | | | | |
|---|---|---|---|---|
| IL | WO 2005003880 A2 * | 1/2005 | ............ | H04J 3/0632 |
| WO | WO 2006/115896 | 11/2006 | | |
| WO | WO 2006115896 A2 * | 11/2006 | ......... | G06F 13/1684 |

OTHER PUBLICATIONS

U.S. Appl. No. 13/904,759, filed May 29, 2013, 43 pages.

(Continued)

*Primary Examiner* — Midys Rojas
*Assistant Examiner* — Khoa D Doan
(74) *Attorney, Agent, or Firm* — Vierra Magen Marcus LLP

(57) ABSTRACT

A topology for memory circuits of a non-volatile memory system reduces capacitive loading. For a given channel, a single memory chip can be connected to the controller, but is in turn connected to multiple other memory devices that fan out in a tree-like structure, which can also fan back in to a single memory device. In addition to the usual circuitry, such as a memory arrays and associated peripheral circuitry, the memory chip also includes a flip-flop circuit and can function in several modes, including pass-through and active modes. Techniques are presented for the addressing of memory chips within such a topology, including an address assignment scheme.

16 Claims, 26 Drawing Sheets

(56) References Cited

U.S. PATENT DOCUMENTS

| | | | | |
|---|---|---|---|---|
| 6,978,314 B2* | 12/2005 | Tarr | H04L 29/06 | 370/254 |
| 6,996,681 B1* | 2/2006 | Autechaud | G06F 15/17337 | 709/252 |
| 7,477,526 B1* | 1/2009 | Co | G11C 5/04 | 361/803 |
| 7,697,332 B2* | 4/2010 | Qu | G06F 11/1044 | 365/185.09 |
| 7,769,781 B1* | 8/2010 | Huntley | G06F 17/30312 | 707/736 |
| 2001/0042147 A1* | 11/2001 | Adams | G06F 15/7832 | 710/100 |
| 2002/0084458 A1* | 7/2002 | Halbert | G06F 13/4256 | 257/63 |
| 2003/0037216 A1* | 2/2003 | Shibata | G11C 5/147 | 711/200 |
| 2003/0131211 A1* | 7/2003 | Kuzmenka | G06F 13/4086 | 711/200 |
| 2004/0103179 A1* | 5/2004 | Damm | H04L 12/1886 | 709/223 |
| 2004/0148482 A1* | 7/2004 | Grundy | G06F 12/06 | 711/167 |
| 2004/0230751 A1* | 11/2004 | Blake | G06F 12/0831 | 711/147 |
| 2004/0230752 A1* | 11/2004 | Blake | G06F 12/0831 | 711/147 |
| 2004/0243769 A1 | 12/2004 | Frame et al. | | |
| 2005/0030797 A1* | 2/2005 | Pax | G11C 5/025 | 365/189.12 |
| 2006/0171244 A1* | 8/2006 | Ando | G06F 12/0897 | 365/52 |
| 2006/0215525 A1* | 9/2006 | Oyama | G06F 11/0727 | 369/59.19 |
| 2006/0265533 A1* | 11/2006 | Hobson | G06F 13/1657 | 710/120 |
| 2006/0285424 A1* | 12/2006 | Gregorius | G06F 13/4243 | 365/233.1 |
| 2007/0005922 A1* | 1/2007 | Swaminathan | G06F 13/1689 | 711/167 |
| 2007/0073446 A1* | 3/2007 | Sequiera | H02J 1/14 | 700/292 |
| 2007/0076502 A1* | 4/2007 | Pyeon | G11C 5/066 | 365/221 |
| 2007/0109833 A1* | 5/2007 | Pyeon | G11C 5/066 | 365/63 |
| 2007/0124532 A1* | 5/2007 | Bennett | G06F 13/1684 | 711/100 |
| 2007/0239906 A1* | 10/2007 | Vakil | G06F 13/4256 | 710/52 |
| 2007/0276977 A1* | 11/2007 | Coteus | G06F 13/4243 | 710/305 |
| 2008/0049505 A1* | 2/2008 | Kim | G06F 13/1694 | 365/185.11 |
| 2008/0158969 A1 | 7/2008 | Moogat et al. | | |
| 2009/0006752 A1* | 1/2009 | Bartley | G06F 13/1684 | 711/122 |
| 2009/0006772 A1* | 1/2009 | Bartley | G06F 12/084 | 711/148 |
| 2009/0070612 A1* | 3/2009 | Adelman | G06F 1/3203 | 713/322 |
| 2009/0157977 A1* | 6/2009 | Gregg | G06F 12/0806 | 711/141 |
| 2009/0172257 A1* | 7/2009 | Prins | G06F 13/1657 | 711/103 |
| 2009/0190482 A1* | 7/2009 | Blair | H04L 43/0858 | 370/250 |
| 2010/0083028 A1* | 4/2010 | Oh | G06F 1/08 | 713/601 |
| 2010/0115172 A1 | 5/2010 | Gillingham et al. | | |
| 2010/0131700 A1* | 5/2010 | Castillo | G06F 12/0246 | 711/103 |
| 2012/0268991 A1* | 10/2012 | Chiao | G11C 16/349 | 365/185.11 |
| 2013/0265067 A1 | 10/2013 | Leedy | | |
| 2014/0244980 A1* | 8/2014 | Mortazavi | G06F 9/50 | 712/220 |
| 2015/0180726 A1* | 6/2015 | Asati | H04L 41/0853 | 398/66 |

OTHER PUBLICATIONS

U.S. Appl. No. 13/904,770, filed May 29, 2013, 48 pages.
Office Action for U.S. Appl. No. 13/904,759 mailed Mar. 27, 2015, 12 pages.

* cited by examiner

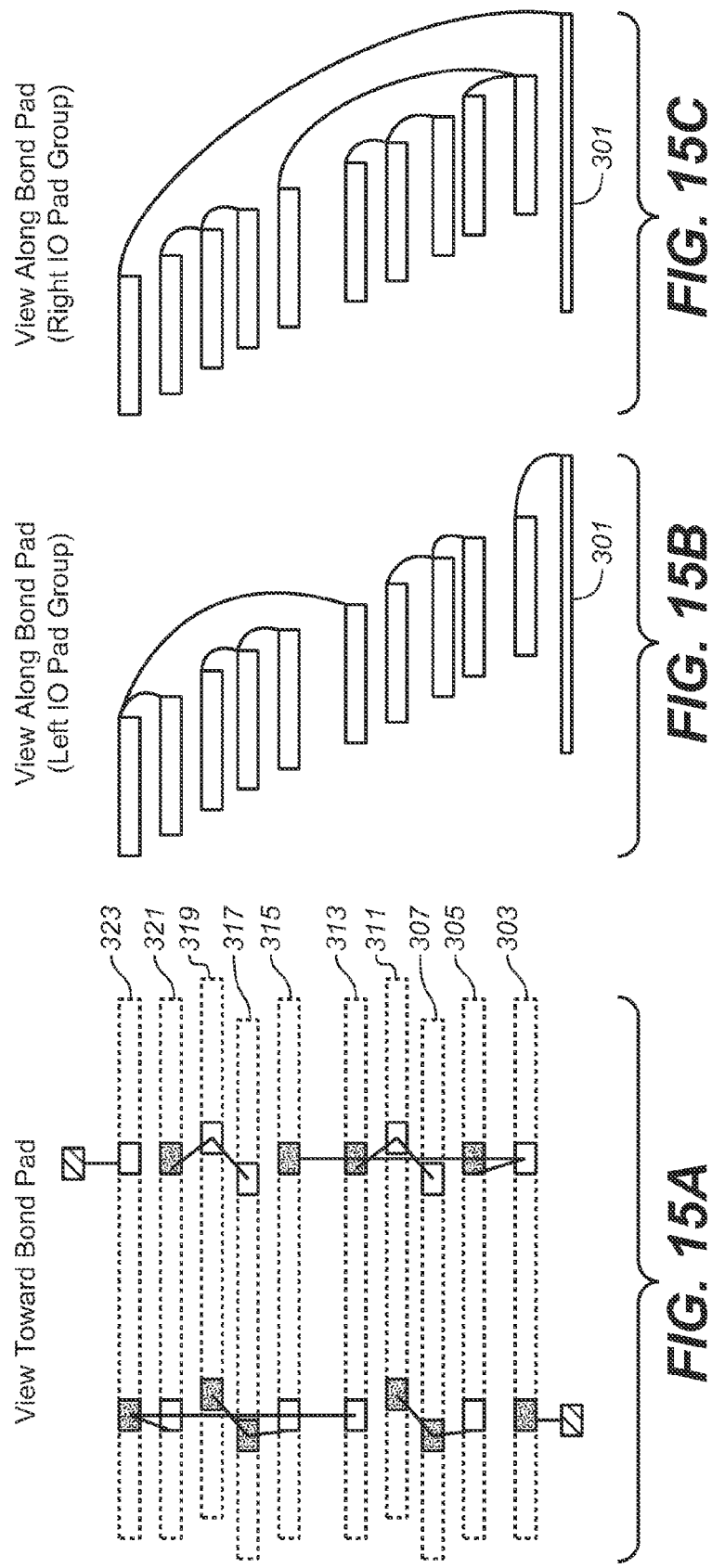

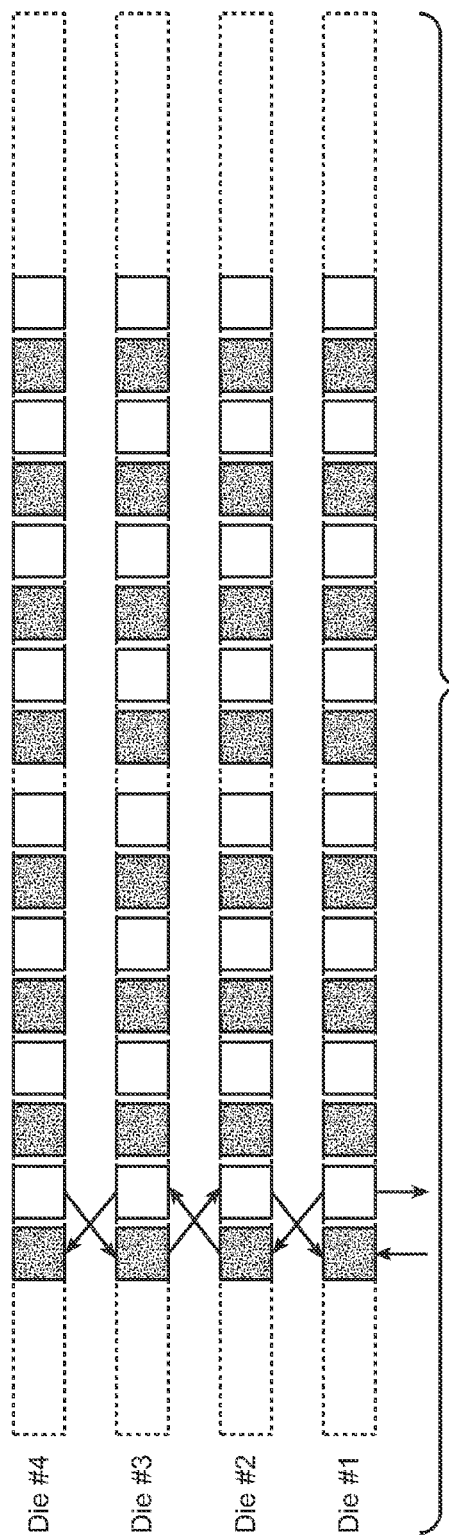
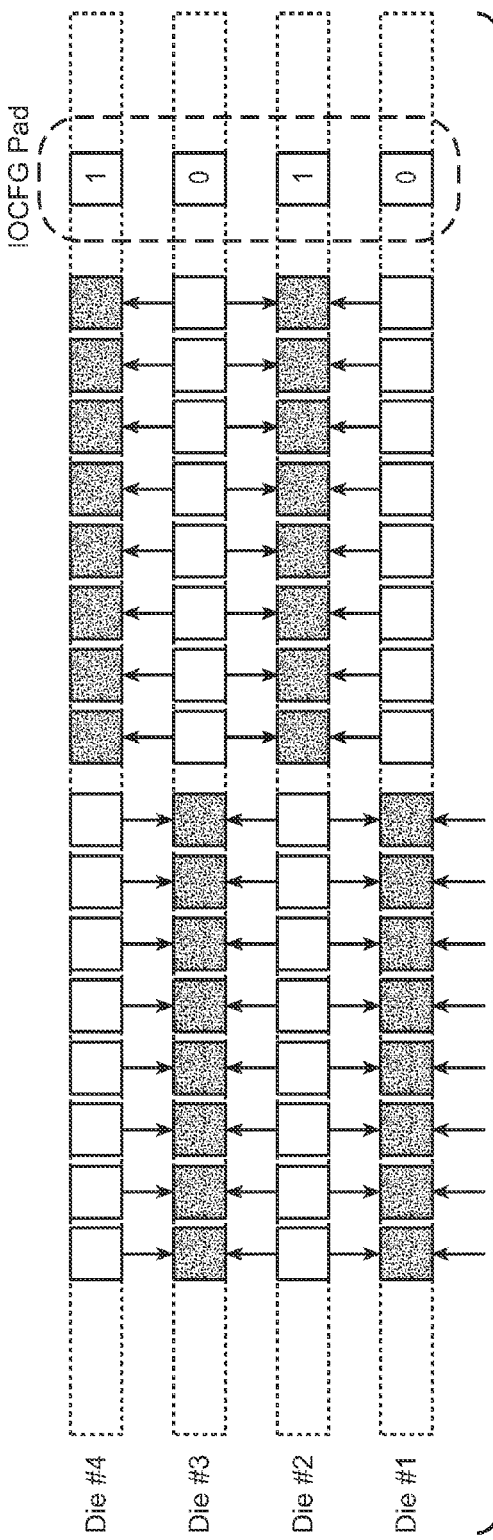
FIG. 16A
FIG. 16B

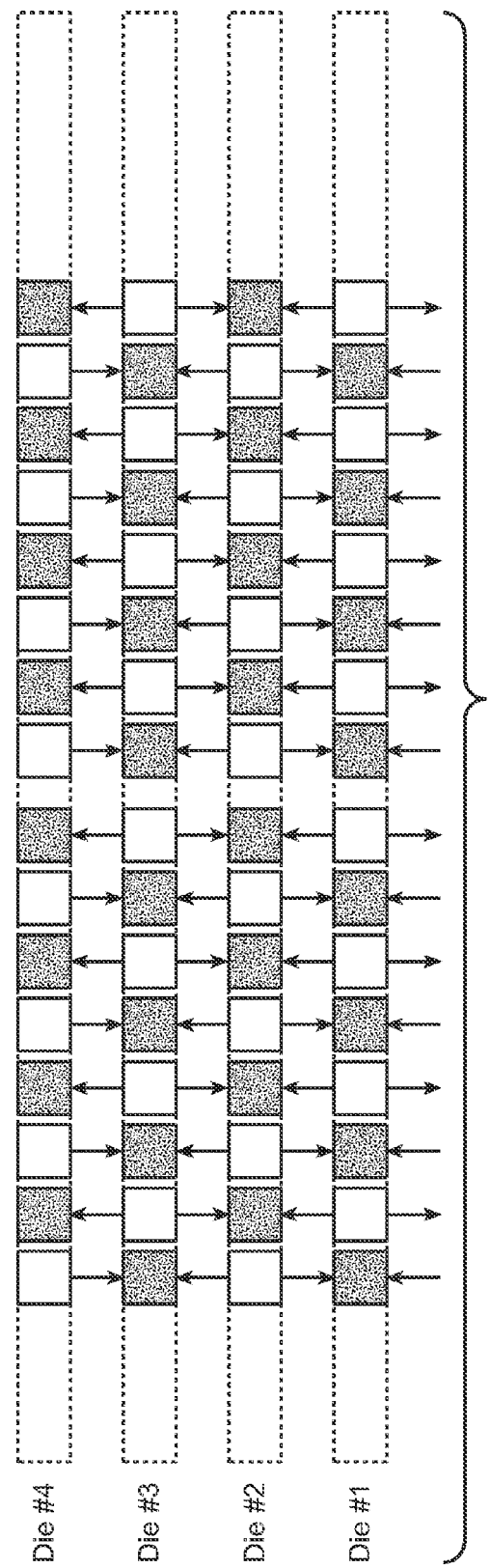

| Conventional | Die Group1 | Die Group2 |
|---|---|---|
| WPn | IN0 | OUT0 |
| WEn | IN1 | OUT1 |
| ALE | CLE/ALE | CLE/ALE |
| CLE | IN2 | OUT2 |
| VREF | IN3 | OUT3 |
| CEn | IN4 | OUT4 |
| RB | IN5 | OUT5 |
| PRENb | IN6 | OUT6 |
| CADD2 | IN7 | OUT7 |
| DQS | CKO | CKI |
| BDQS | CKOn | CKIn |
| REn | CKI | CKO |
| BREn | CKIn | CKOn |
| IO0 | OUT0 | IN0 |
| IO1 | OUT1 | IN1 |
| IO2 | OUT2 | IN2 |
| IO3 | OUT3 | IN3 |
| IO4 | OUT4 | IN4 |
| IO5 | OUT5 | IN5 |
| IO6 | OUT6 | IN6 |
| IO7 | OUT7 | IN7 |
| X1IO/CADD0 | SKO | SKI |
| SKn/CADD1 | SKI | SKO |
| VMON/IOCFG | VDD | VSS |

*FIG. 18A*

| Conventional | Die Group1 | Die Group2 |
|---|---|---|
| WPn | IN0 | OUT0 |
| WEn | OUT0 | IN0 |
| ALE | CLE/ALE | CLE/ALE |
| CLE | IN1 | OUT1 |
| VREF | OUT1 | IN1 |
| CEn | IN2 | OUT2 |
| RB | OUT2 | IN2 |
| PRENb | IN3 | OUT3 |
| CADD2 | OUT3 | IN3 |
| DQS | CKI | CKO |
| BDQS | CKO | CKI |
| REn | CKIn | CKOn |
| BREn | CKOn | CKIn |
| IO0 | IN4 | OUT4 |
| IO1 | OUT4 | IN4 |
| IO2 | IN5 | OUT5 |
| IO3 | OUT5 | IN5 |
| IO4 | IN6 | OUT6 |
| IO5 | OUT6 | IN6 |
| IO6 | IN7 | OUT7 |
| IO7 | OUT7 | IN7 |
| X1IO/CADD0 | SKO | SKI |
| SKn/CADD1 | SKI | SKO |
| VMON/IOCFG | VDD | VSS |

*FIG. 18B*

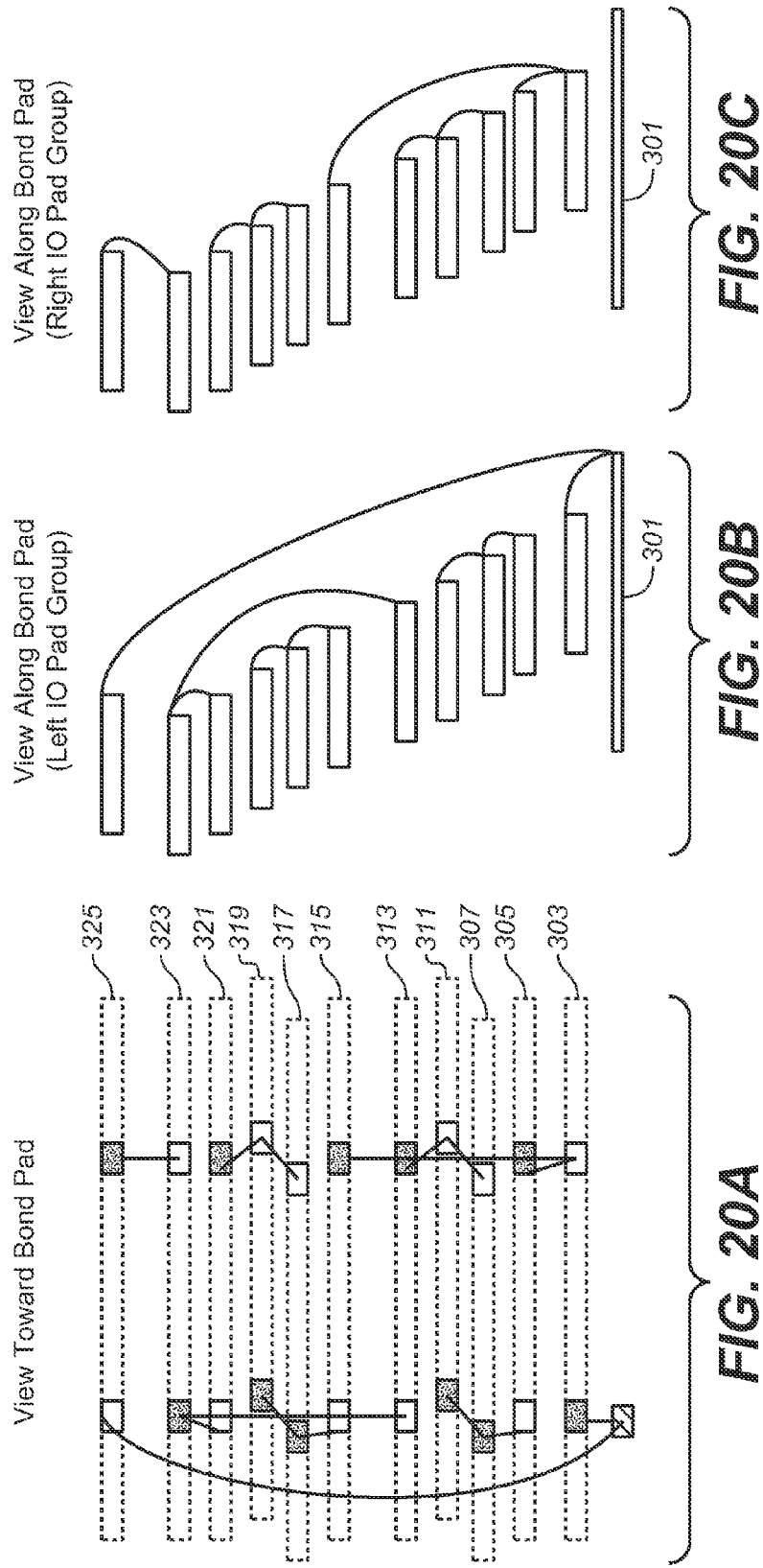

ADDRESSING AUTO ADDRESS ASSIGNMENT AND AUTO-ROUTING IN NAND MEMORY NETWORK

FIELD OF THE INVENTION

This invention pertains generally to the field of non-volatile memory and, more particularly, to the topology of the memory chips within such systems.

BACKGROUND

Non-volatile memory systems, such as those formed from NAND flash memory chips, typically include one or more controller chips connected to multiple memory chips. In some cases, such as in solid state drives (SSDs), the number of memory chips can be quite large. For example, with a NAND density of 128 Gb, or 16 GB, a 8 TB SSD drive with 100% over-provision (redundancy) would have 1024 NAND chips. If the system has 16 input/output (IO) channels, each channel has 64 NAND chips. The capacitive pin loading load of NAND chips impose limitations on system clock operation frequency to ensure signal integrity as the drivers may not be able to handle the cumulative load. Because of this, it is a challenge to push data transfer rates to higher frequencies.

SUMMARY OF THE INVENTION

According to a first set of general aspects, a non-volatile memory system includes a memory section and a controller circuit. The memory section has a plurality of non-volatile circuits each having a first set of bus connections and a second set of bus connections and a bus structure. The bus structure connects the memory circuits in a tree-type of arrangement that includes a front section, the front section having a series of multiple tiers in which, for each tier except the last in the series of the front section, the second set of bus connections of memory circuits in each tier branch out and connect to the first set of bus connections of a set one or more memory circuits of the subsequent tier in the series, and where the first set of bus connections of the one of more memory circuits of the first tier are connected to a corresponding branch from an input bus section. The controller circuit is connected to the input bus section, wherein the controller circuit addresses the memory circuits according to a tier address that identifies the tier to which an addressed memory circuit belongs and, for the identified tier and each preceding tier, a sub-address that identifies the branch to which the memory circuit belongs.

Further aspects relate to a method of assigning addresses to memory circuits of a non-volatile memory system. In the memory system a plurality memory circuits each have a first set of bus connections and a second set of bus connections and are connected by a bus structure in a tree-type of arrangement. The tree-type of arrangement includes a front section, the front section having a series of multiple tiers in which, for each tier except the last in the series of the front section, the second set of bus connections of memory circuits in each tier branch out and connect to the first set of bus connections of a set one or more memory circuits of the subsequent tier in the series, and where the first set of bus connections of the one of more memory circuits of the first tier are connected to a corresponding branch from an input bus section. The method includes determining a tier address for each of the memory circuits by propagating a signal from the input bus section through the series of tiers according to a clock, wherein the tier address is determined based upon the number of clock cycles required for the signal to propagate to a corresponding memory circuit. An intra-tier sub-address is determined for each of the memory circuits of the front section by sequentially propagating a signal within each set of memory circuits branching out from a common memory circuit in the preceding tier according to a clock, wherein the intra-tier address is determined based upon the number of clock cycles required for the signal to propagate to a corresponding memory circuit. An address is assigned to each of the memory circuits according to the corresponding determined tier address, the corresponding intra-tier sub-address, and for the front section the intra-tier sub-addresses for each preceding tier of the front section identifying the corresponding branch to which the memory circuit belongs.

Various aspects, advantages, features and embodiments of the present invention are included in the following description of exemplary examples thereof, whose description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIGS. 15A-C illustrate the connections between the input and output pads of the chips in a package from different views.

FIGS. 16A-C illustrate the pad connections in more detail for the multiple pads of a device.

FIGS. 18A and 18B show exemplary sets of pad assignments.

FIGS. 20A-C correspond to FIGS. 15A-C, but for an 11-chip package with both the input and output pads placed together on the package board.

DETAILED DESCRIPTION

As discussed in the Background, non-volatile memory systems having large numbers of memory chips, such as a NAND based solid state drive (SSD) can suffer from large amount of capacitive loading on pins of the memory chips, limiting transfer rates. The following addresses this problem by introducing a topology for the memory chips that can significantly reduce the capacitive loading, allowing for much higher IO data transfer rates.

Figure 1:
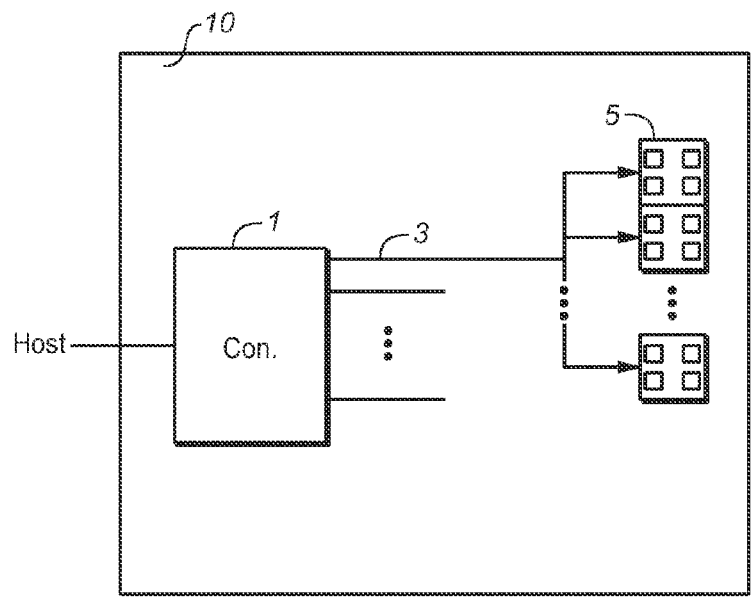
FIG. 1 is an example of a solid state drive having multiple channels, each with a large number of memory chips attached.
Figure 2:
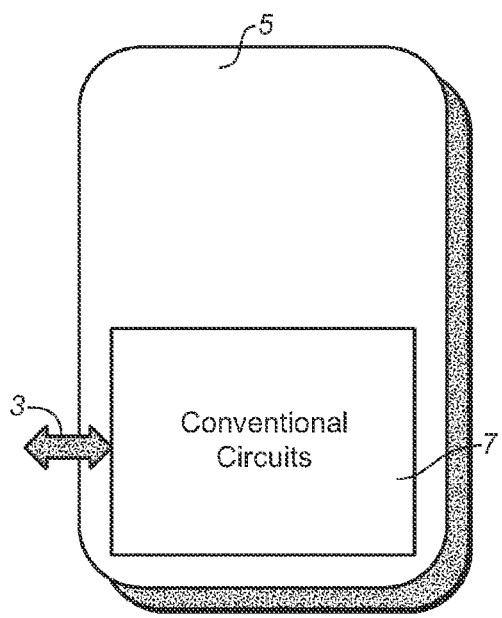
FIG. 2 is a schematic illustration of a NAND memory chip.

FIG. 1 can be used to consider the problem further. An SSD system 10 includes a controller 1 that has a number (16 in this example) of IO channels, each connected by a bus structure (such as shown IOC-1 3) to a number of memory chips, such as the NAND chip 5. Here, each channel has 64 memory chips for a total of 1024 chips, so that with a NAND density of 128 Gb, or 16 GB, 100% over-provision, this results in a 8 TB SSD drive. FIG. 2 is a schematic illustration of a NAND memory chip 5 as attached to the bus structure 3. Although the present discussion is given in the context of NAND type flash memory chips and as SSD drive, as the issue being dealt with is the capacitive loading on the bus structure, the techniques are not specific to this example. In particular, what is here referred to as the conventional circuitry portion 7 of the memory chip can be any sort of memory technology. To provide a concrete example for purposes of discussion, though, the following will be based on the NAND memory SSD drive example. More detail on NAND memory devices can be found in US patent and publication numbers 20080158969; U.S. Pat. Nos. 5,570,315; 5,903,495; and 6,046,935, for example. More detail on SSD drives is given in US patent publication number US20090172257, for example.

In a first set of aspects, the memory chip includes a new alternate or additional interface relative to the chip's existing interface. This interface can be controlled by an internal ROM fuse, for example. This new interface can also help to the overloading of pins with features that are found on convention interfaces. This additional interface is illustrated with respect to FIG. 3.

Figure 3:
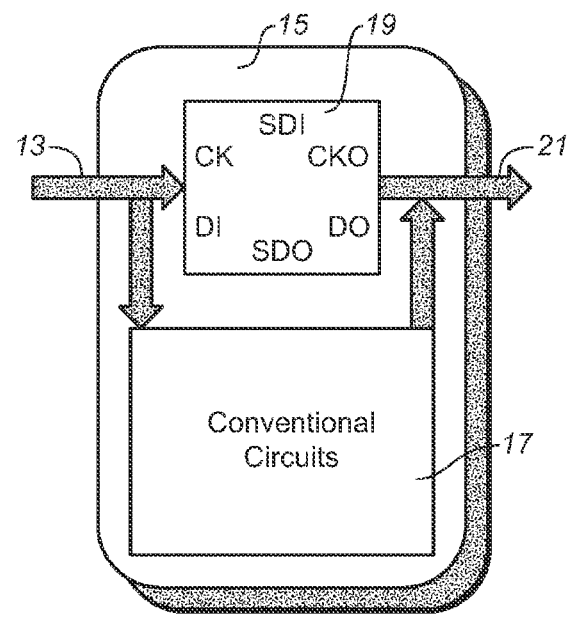
FIG. 3 schematically illustrates the inclusion of the alternate interface into the memory chip.

FIG. 3 schematically illustrates the inclusion of the alternate interface. The memory chip 15 again includes the "conventional" circuits 17 that would be found on a memory circuit, but now also includes as part of the additional interface a D flip-flop (DFF) 19 for receiving data and for receiving and buffering control signals. The bus connections to the chip 15 now include an input bus 13 and an output bus 21. (FIG. 3 shows the input bus 13 and output bus 21 on opposite sides of the chip for illustrative purposes, but in practice the corresponding pins can be variously located around the chip.) In the exemplary embodiment, for versatility the memory chip can be used with the standard interface, as in FIG. 2, or in this new arranged, where this can be controlled by way of an internal ROM fuse, for example. Under this new arrangement, the pin assignments would differ from the convention case, where rather that a set of, say, 8 pins being set aside for IO function, the input bus 16 would instead have 8 input lines and the output bus 21 would have 8 output lines.

Figure 4:
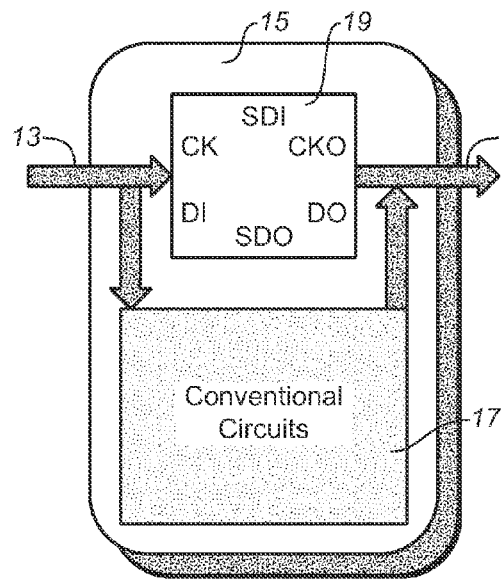
FIGS. 4-6 illustrate different modes of operation for the memory chip of FIG. 3.

The memory chip 15 can operate in an active mode and a pass-through mode, with it typically useful to also have a stand-by mode. These modes are illustrated schematically in FIGS. 4-6. FIG. 4 illustrates the standby mode, where the primary circuit portion 17 is not active and data is passed from the input bus 13 to the output bus 13. Addresses and commands, though, are clocked through the chip from the input bus 13 to the output bus 21.

Figure 5:
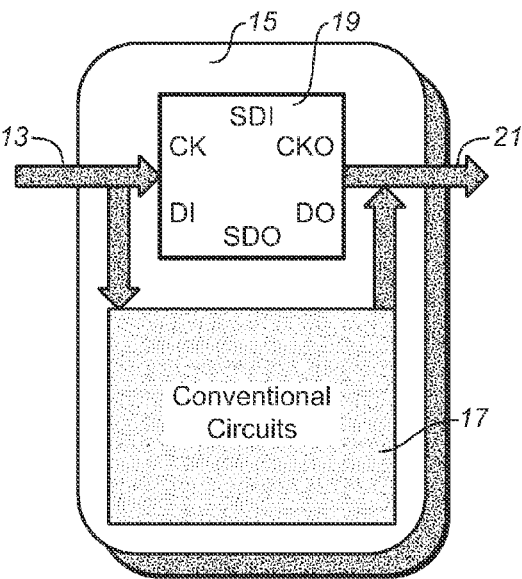

In the pass through mode, illustrated in FIG. 5, the circuit portion 17 is still inactive, but now in addition to passing commands, data is also passed though the DFF 19 from the input bus 13 to the output bus 21. In the active mode, schematically illustrated in FIG. 6, the primary circuit portion 17 is now active, as well as the DFF 19 of the interface. Addresses and commands can again pass through from the input to the output, but data does not pass when the device is selected: in the case of a write, data received on the input lines of the bus 13 would be transferred on to the array; and, in the case of a read, data would be transferred of out of the primary circuit portion 17 and on to the output bus 21.

Figure 7:
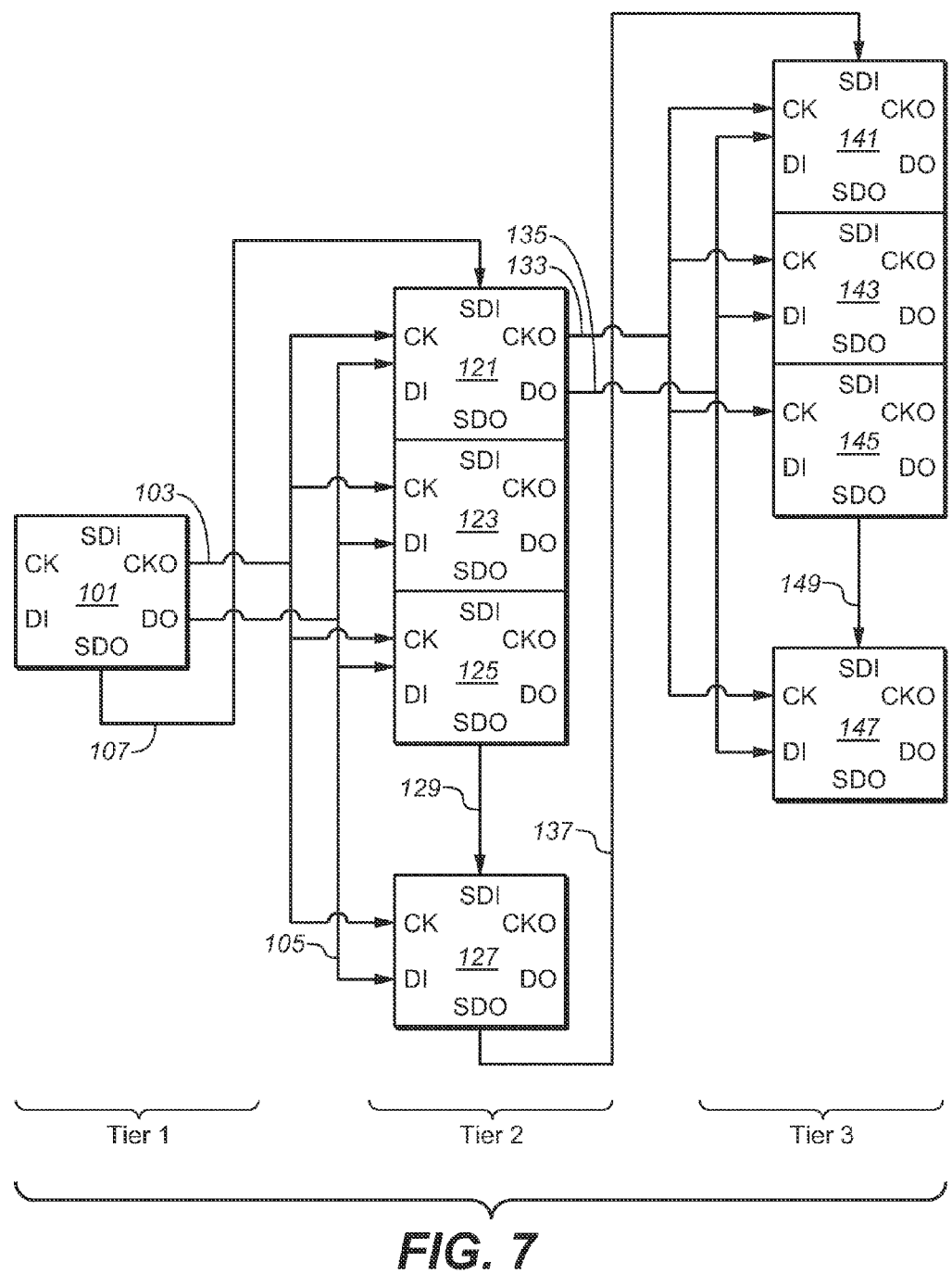
FIG. 7 illustrates an exemplary embodiment for a topology of a set of memory chips arranged into a tree type of structure.

The ability of the interface based on the DFF 19 to pass commands, addresses and data from the input bus 13 to the output bus 21 allows for the memory chips to be connected according to a topology that can significantly reduce the amount of capacitive loading on the pins. This is described with respect to FIG. 7. As shown in FIG. 7, a set of memory chips are arranged into a tree type of structure, shown here to a depth of three tiers with each branch having a depth of 4 shown chips, where here each of the chips is being represented by its DFF portion. A first chip 101 in the arrangement would be connected to receive commands, addresses and data the DI input and a clock signal at CK from the controller. This would then be the only one of the tree of memory chips for the channel whose input bus is driven by the controller.

The output data lines 105 from 101 at DO are then connected to the data input DI at each of the (in this example) four chips 121, 123, 125, 127 of the second tier. Similarly, the output clock from CKO of 101 is supplied along 105 to the clock input CKI of each of the second tier chips. This process is then repeated at tier 3, where each of the tier 2 chips are connected to drive a number (four again, in this example) of chips, where only the chips 141, 143, 145, 147 being fed by chip 121 are shown to simplify the diagram for purposes of discussion. The data out lines of chip 121 are connected over 135 to the data input pins of each of 141, 143, 145, 147, with the clock signal transferred from CKO of 121 over line 133 to the CKI pin of each of 141, 143, 145, 147. Under this arrangement, each device only drives four chips at most, relative to the arrangement of FIG. 1 where each IO channel from controller drives 64 chips. In addition to the tree-like structure of the tiers, the devices are also connected serially through their serially data outputs (SDO) and serial data inputs (DSI). The SDO output of chip 101 is carried over the line 107 to a first of the chips of the second tier, which are all connected serially, as is shown explicitly at 129. The last chip of tier 2 then has its SDO connected over 137 to the SDI input of the first of the chips in the series for tier 3, and so on, where one of the serial connections of tier 3 is shown explicitly at 149. The use of the serial clock can then be used in the selecting of the desired device.

Figure 8:
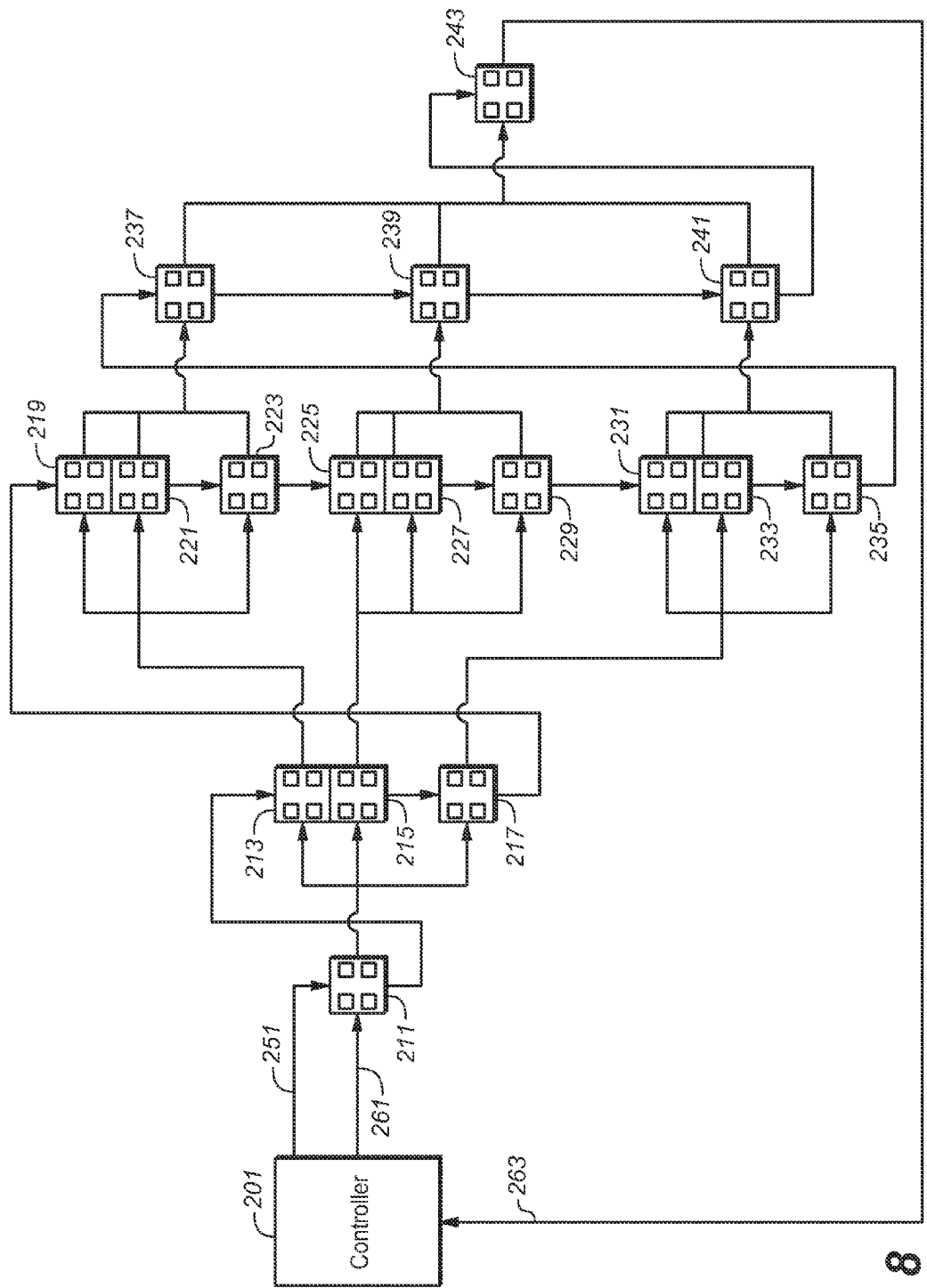
FIG. 8 shows a fuller development of the topology of the memory circuits within the memory system.

FIG. 8 shows a fuller development of the topology of the memory circuits within the memory system. In particular, this example only shows a single one of the IO channels from the controller 201 connected to a memory section having the memory chips connected according to a tree-like topology. This example for the memory section has five tiers that branch out with a branching ration of 3 at the second and third tiers, before shrinking back down in the last two stages. This particular example is symmetric both respect to how it branches out and then back in and in that the branching ratio for each chip, whether out or in, is the same. Although this symmetric is generally preferable in many cases as it more evenly distributes loading, other less symmetric arrangements can also be used.

In the exemplary arrangement of FIG. 8, the controller 201 is only directly by the IO channel output bus to the first chip 211 in the tree structure. (In FIG. 8, each memory device is again represented only by the DFF of its interface.) Here the portion of the bus structure 261 includes both the data and clock input, DI and CK. The serial clock signal is shown separated out from the other command, address, and data signal to illustrate its serial structure, as opposed to the tree structure used by the other lines. The segments of the main bus then branch from the first to the second, and second to the third tier as described above with respect to FIG. 7, and then, going from the third to the fourth and fourth to fifth tier, mirror this arrangement by fanning back in to the last device 241. The output bus section 263 from the last tier is then the input for the IO channel. The serial output bus 251 from the controller then works its way serially through the tiers and serially within each of the tiers.

Figure 9:
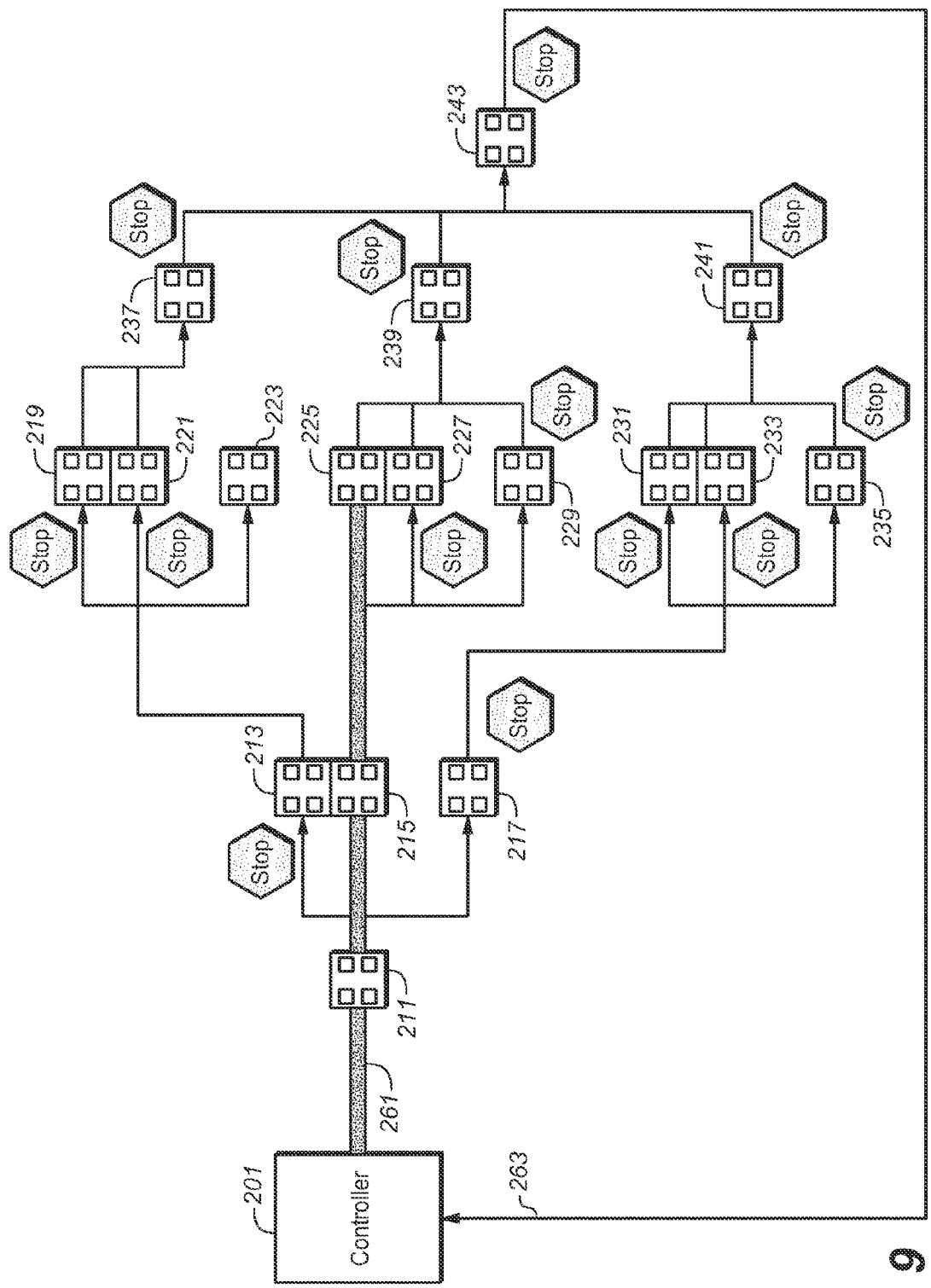
FIGS. 9 and 10 respectively show the flow of data in a write and a read operation for the elements of FIG. 8.

FIG. 9 shows the same elements as in FIG. 8, but without explicitly including the serial connections, and can be used to illustrate the flow of data for a write operation and how the different device modes are used. In this example, device 225 in the third tier is selected for a write operation. Consequently, device 225 is selected and placed in the active mode. As the path from the controller 201 to device 225 passes through chips 211 and 215, these need to pass the data as well as any commands and addresses and are in the pass-through mode. Any of the other devices that are not needed can then sleep in the stand-by mode, not passing data and saving power. As stand-by mode allows the any commands to pass, any status signals needing to be returned to the controller can pass through devices 239 and 243 and back along section 263 of the bus structure.

Figure 10:
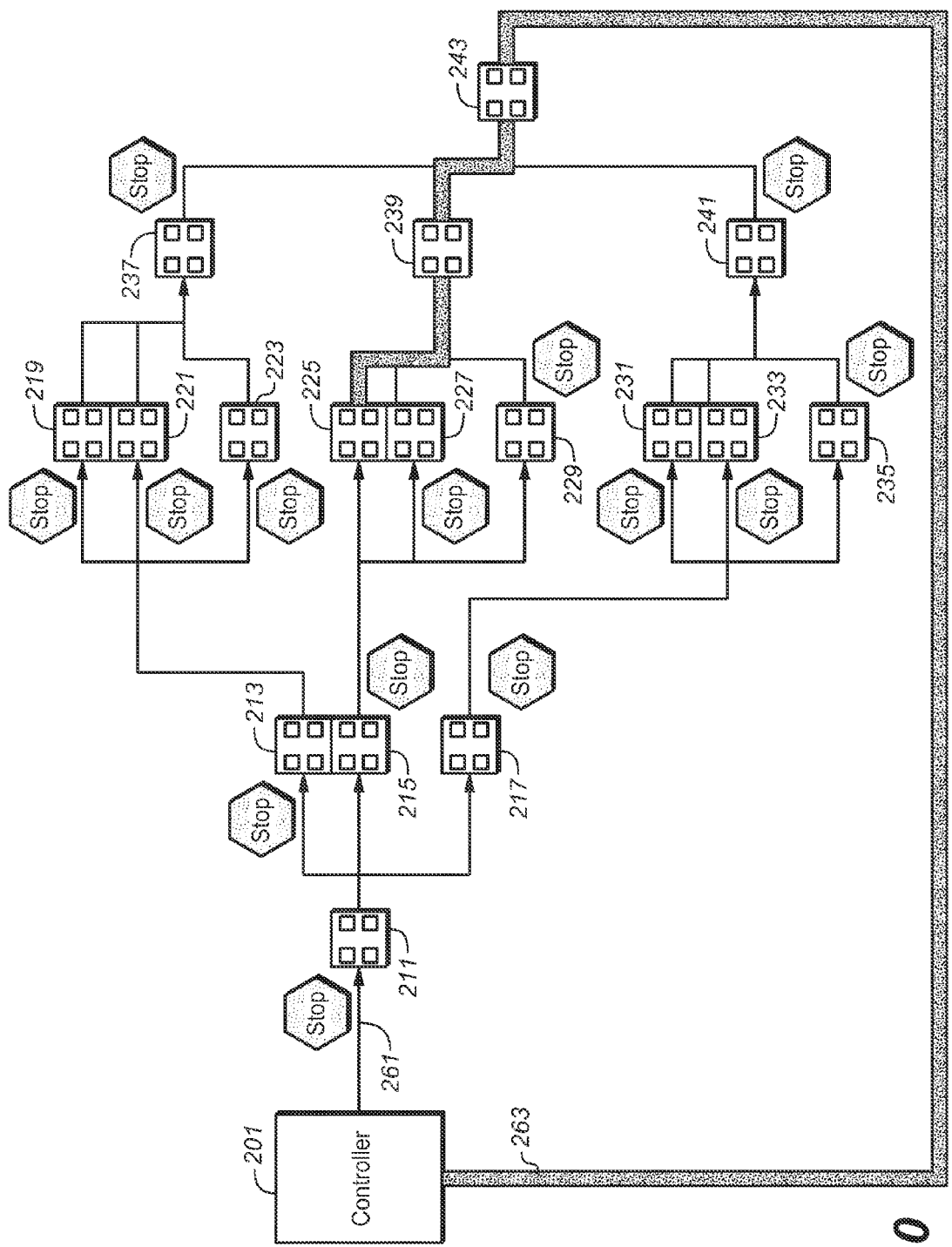

FIG. 10 illustrates the read counterpart to the write operation of FIG. 9. Device 225 in the third tier is again selected, but this time for a read operation, and is correspondingly in the active mode. As devices 239 and 243 need to pass the data back to the controller over bus segment 263, they will be in the pass-through mode. The rest of the memory devices can sleep to save on power, where chips 211 and 215 pass the commands and addresses to the selected device 225.

Figure 11:
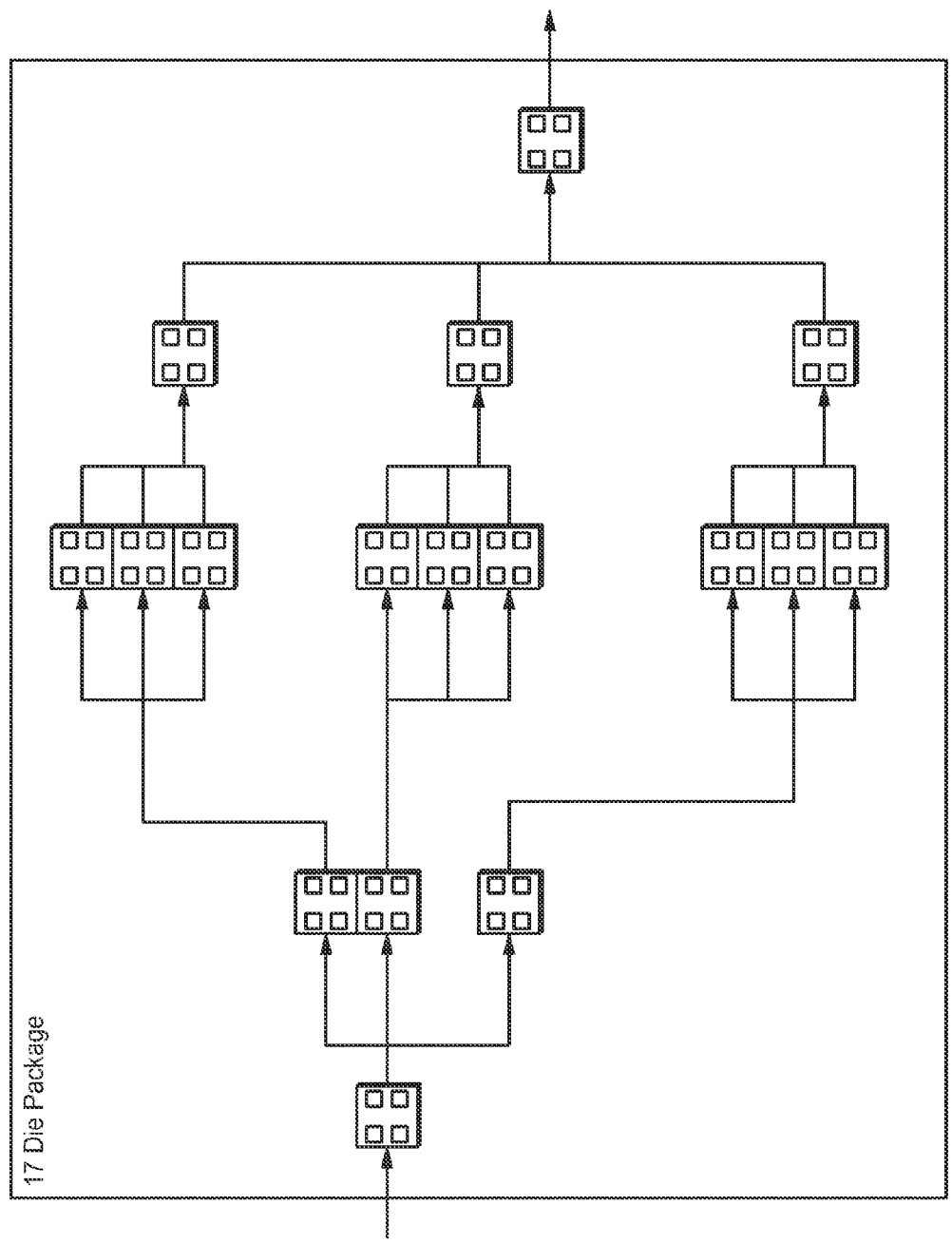
FIG. 11 shows the memory section of FIG. 8 arranged into a single package.
Figure 12:
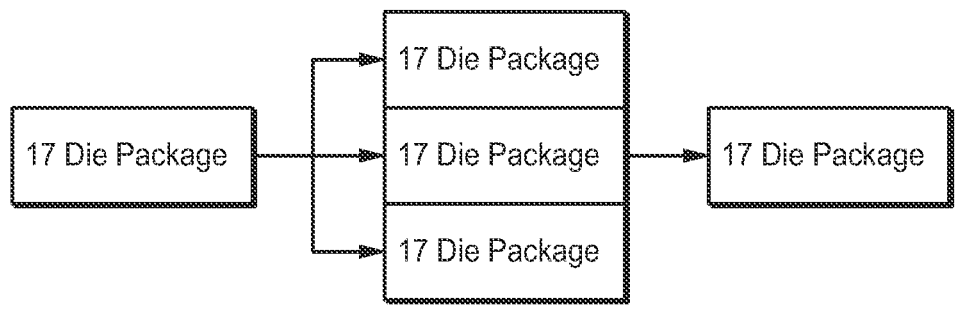
FIG. 12 illustrates how the packages of FIG. 11 can be arranged into a tree structure.

The memory section of FIG. 8 can be arranged into a single package, as shown in FIG. 11. Here the 17 die are formed into a single, 17 die package. As the input is only supplied to a single chip, the input loading is only one memory chip. Similarly, the output loading is only a single chip. The pin count is also corresponding reduced relative to a package where all of the chips directly attach to the bus structure. The internal loading is 1 memory chip driving at most 3 other chips. For a larger memory section, the packages also themselves can be arranged into a tree structure as shown in FIG. 12. Arranged in three tiers with a fan out of three, the 5 17 die packages can provide a channel with a total of 85 dies, again with an output and input loading of only a single device and an internal loading of no more than 3 devices. The structures of FIG. 12 can then themselves be arranged into a tree structure and the board level for an even larger capacity memory channel.

Figure 13:
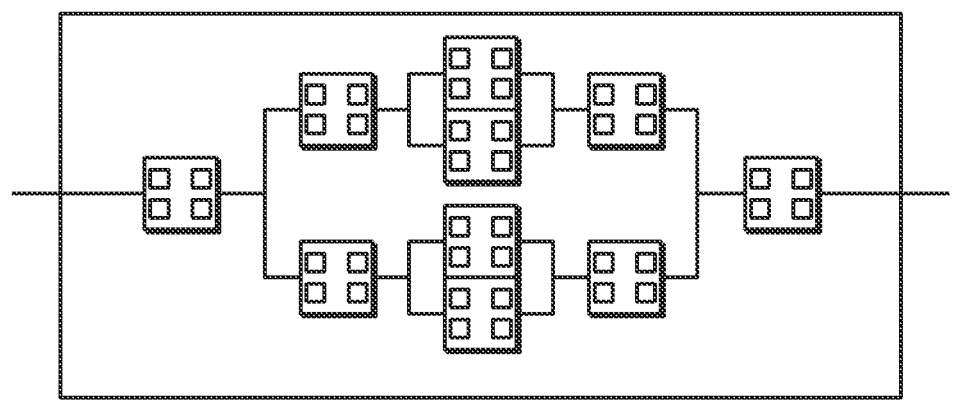
FIG. 13 shows another package embodiment, with 5 tiers and a fan out of 2, resulting in a 10 die package.
Figure 14:
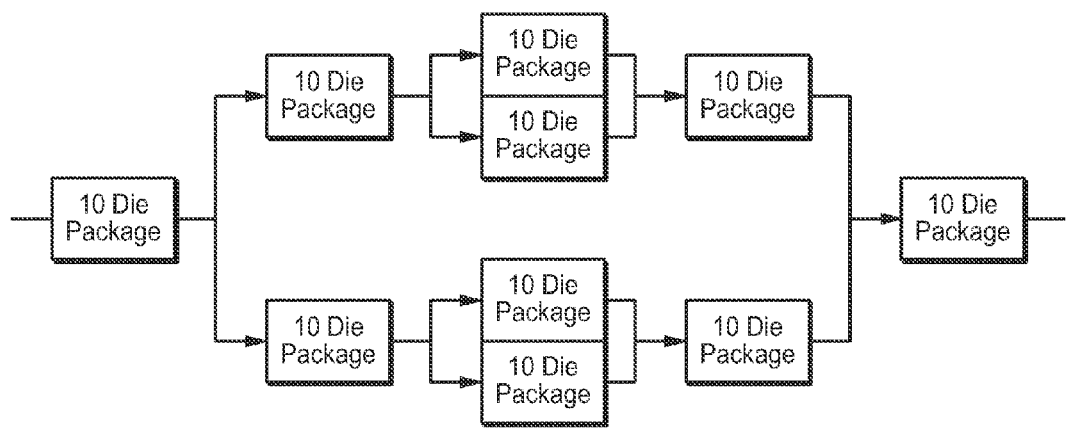
FIG. 14 illustrates the 10 die packages of FIG. 13 arranged into a 5 tiers with a fan out of two, for a total of 100 dies.

FIG. 13 looks at another package embodiment, which again has 5 tiers, but with a fan out of 2, resulting in a 10 die package. These can 10 die packages can then also be arranged into a 5 tiers with a fan out of two, for a total of 100 dies, as shown in FIG. 14. Consequently, using 16 channels supporting a total of 1600 dies would provide for 25.6 TB of storage based upon 16 GB dies. A 6 TB system with 100% over-provisioning can similarly be built with only 8 channels.

Within the package, the input and output pad sets can be swapped from chip to chip to more efficiently implement the topology. This can shorten and simplify the connections between the outputs of one tier with the inputs of the following tier. One exemplary embodiment for the 10 die package of FIG. 13 is illustrated schematically with respect to FIGS. 15A-C. FIGS. 15A-C show the 10 chips (303, 305, 307, . . . , 323) stacked up on the package board 301. FIG. 15A is a view from the front, toward the bond pads with the input pads shown in black, the output pads as white, and the gray pads at top and bottom are those for the package. Here the collective input and output pads are each represented by a single pad, one to the right and one to the left of the edge of each chip. FIG. 15B then would be the view along the bond pad of the stack from the left hand side showing only the left IO pad group. FIG. 15C is then the right hand side counterpart of FIG. 15B. For example, as shown on the fright side of FIG. 15A and in FIG. 15B, the bottom chip 303 has its input pads connected to the packages input pads. As shown on the left side of FIG. 15B and in FIG. 15C, the output pads of 303 are then connected to the inputs of 305 and 315 for the fan out of two. The other connections are similarly represented.

As noted, FIGS. 15A-C represented each of the input and output pads by a single collective pad. FIGS. 16A and 16B illustrate the situation in more detail for the multiple pads of a device, here in an example with 8 each for input and output for four of the dies, where both sets are grouped together. FIG. 16A illustrates the problems that can arise without the swapping of input and output pads, as the bonding wires would need to be constantly crossing between chips in the package, makings implement the desired topology very difficult on the package level. To solve this packaging issue, the pads belonging to the same pipelines can be aligned as illustrated in FIG. 16B. Both arrangements of the pads can use the same version of the chip, but the sets of pads can used either for input or output. The differentiation between input and output can be done several ways, such as through a command, an internal fuse control, or through the bonding pad. In the preferred embodiment, a bonding pad is used, which can be set at either Vcc or Vss to determine which set is for input and which is for output. This is illustrated in FIG. 16B by the configuration pad IOCFG, that can be used to configure which pad group is used for input and which is used for output. In FIG. 16B, the elements of each set are shown to be adjacent to each other, but these may distributed differently; for example, they could alternate as in FIG. 16A, but with the assignments of dies 2 and 4 swapped, such as is shown in FIG. 16C. In FIG. 16C, the configuration of the sets of pads can be done similarly to as described with respect to FIG. 16B, such as with a configuration pad IOCFG (not shown in FIG. 16C).

Figure 17:
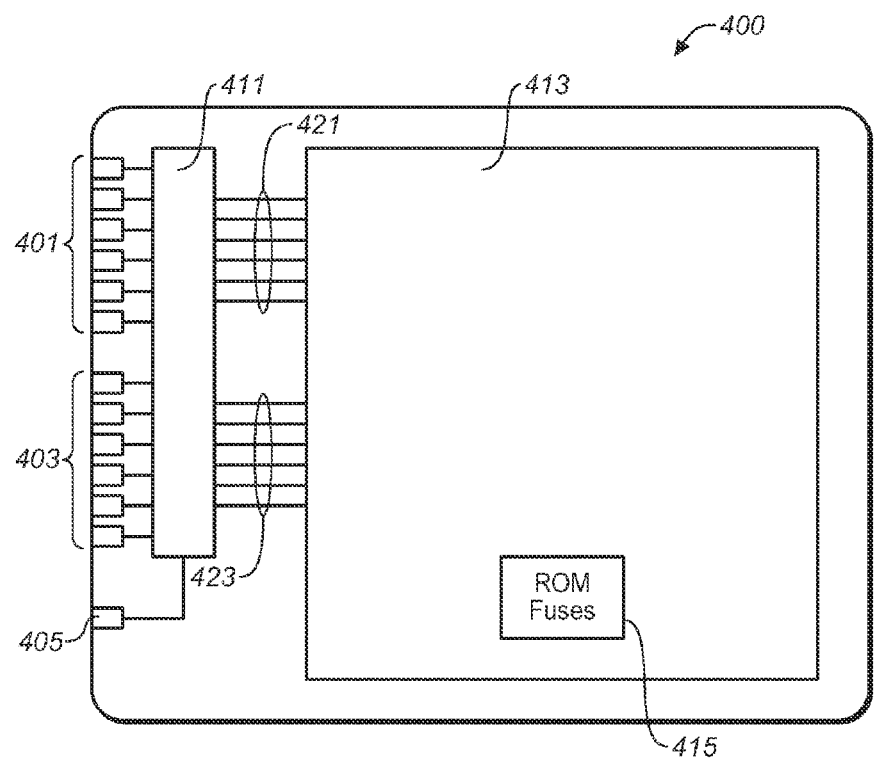
FIG. 17 is a simplified box diagram to illustrate an example of how the swapping of input and output pads can be implemented.

FIG. 17 is a simplified box diagram to illustrate an example of how this swapping of input and output pads can be implemented. A memory chip 400 has a series of pads represented 401, 403 and 405. The pads include the input output configuration IOCFG pad 405 and the two equal sets 401 and 403 of pads that are connected to the switchable connection circuit 411. The other elements of the circuit are grouped together as block 413 with a set of output lines 421 and a set of 423. Based on the level at the IOCFG pad 405, the lines 421 can be attached to the pad set 401 or the pad set 403, with the lines 423 going to the other set. Although the exemplary embodiment uses a specific bonding pad to determine the connection, other embodiments can be based on a command or internal fuse control.

Both in FIG. 17 and in FIG. 16B, the elements of each set are shown to be adjacent to each other, but these may distributed differently; for example, they could alternate as in FIG. 16C, but with the assignments of dies 2 and 4 swapped. This is illustrated in FIGS. 18A and 18B that show an exemplary set pad assignments for a more conventional arrangement (in the first column) and then the pad assignments for the case of a swappable set of input and output pads. The Die Group 1 column shows one alignment, here implemented by setting the IOCFG pad to VDD (bottom row), and the Die Group 2 column shows the swapped alignments, here implemented by setting the IOCFG pad to VSS. In the conventional assignments, a number of pads (such as IO0-IO7) function as input-output pads, while in the other columns a number of pads have specific input or output assignments, where these are swapped based on the on the IOCFG level. (Note that although most pads swap depending on their group assignment, the latch enable signal, CLE/ALE, is the same in both assignments.) In FIG. 18A, the IN and OUT pads are grouped together, as illustrated in FIG. 16B, while FIG. 18B illustrates an interleaved arrangement, similar to FIG. 16B, but with swapping between Die Groups 1 and 2. Additionally, as shown in FIGS. 16B and 17, all of the pads except the IOCFG pads swap, but there can also be other pins (not shown), such as a clock signal or supply level, that go straight through and stay with the same pad assignment independently of the IOCFG level.

Figure 19:
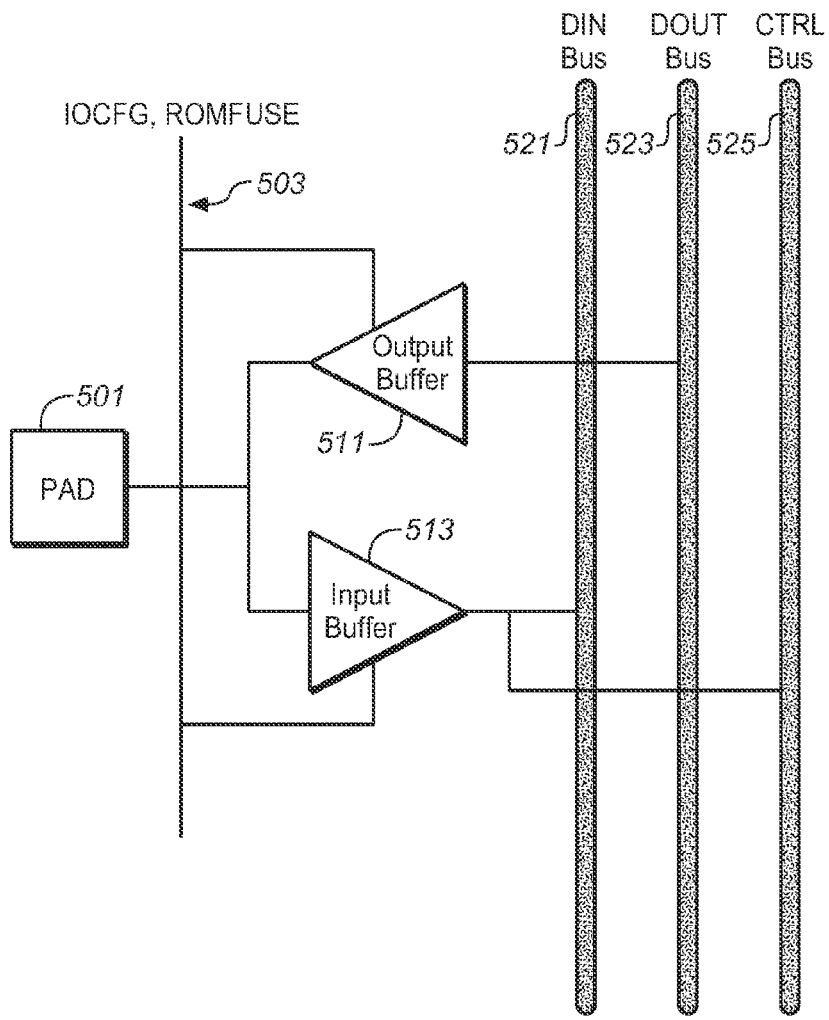
FIG. 19 looks at the swapping mechanism for a given pad in more detail.

FIG. 19 looks at the swapping mechanism for a given pad in more detail. Pad 501 is one of the swappable pads of the device, which here has the internal data-in DIN bus 521, data-out DOUT bus 523, and control CTRL bus 525. These buses are then connectable to the pad 501 through either an output buffer 511 or an input buffer 513. Based on the value on line 503, such as set by a ROMFUSE or the IOCFG, the pad 501 either functions as an input to supply data and commands to the DIN 521 and CTRL 525 buses or as an output to receive data from the DOUT bus 523.

As noted above, in the exemplary embodiment the memory chip can be operated in one mode with the pins assigned as developed above, with a number of pins being set aside as input bus lines and a similar number set aside as output bus lines, or in mode using a standard interface, as in FIG. 2 and with pad assignments such as in the "conventional" columns of FIGS. 18A and 18B. This can be controlled by way of an internal ROM fuse, for example, such as those represented at 415 of FIG. 17. This increases the versatility of the chip. As the need to swap the connections to the pads 401 and 403 would not be needed when the pads are assigned in the conventional mode, the swap function of 411 would not be used and the pad 405 would be used and could be reassigned to a different function the conventional pad assignment mode. Although the sort of tree like structure described above can be optimal for large size systems, for smaller systems the conventional assignments can be preferable for medium or smaller sized systems.

Figure 21:
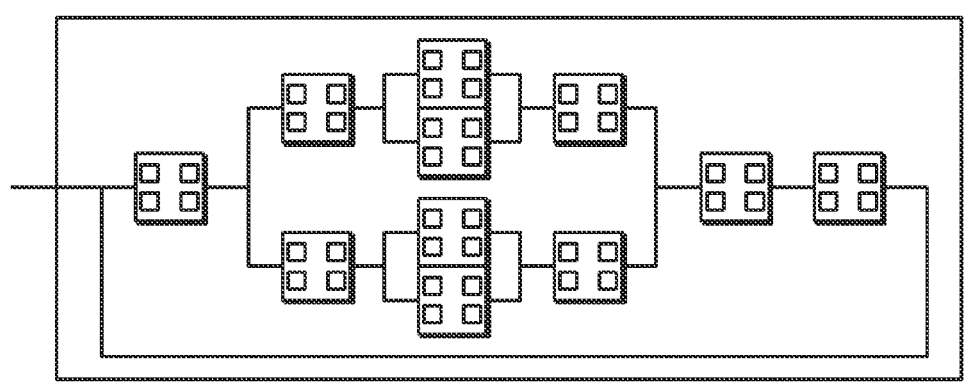
FIG. 21 illustrates a corresponding topology of the chips for an 11-chip package.

FIGS. 20A-C correspond to FIGS. 15A-C, but with an alternate assignment of pads with both the input and output pads placed together on the package board 301. More specifically, the lower chips are arranged the same, but with one more chip 325 added, making a 11-chip package. In this arrangement, the input of the lowest chip 303 and the output of the top chip 325 are both to the right. FIG. 21 then illustrates the corresponding topology of the chips in a package. As with 10 die package of FIG. 13, this alternate embodiment also uses a maximum fan-out of 2, but includes the last chip to the left whose output now also lies along the left side of the package of this alternate embodiment. As noted above, the tree structure need not be symmetric and in other embodiments, other or additional 1-1 chip arrangements can be added before or after the fan out or even in the central portions.

Figure 22:
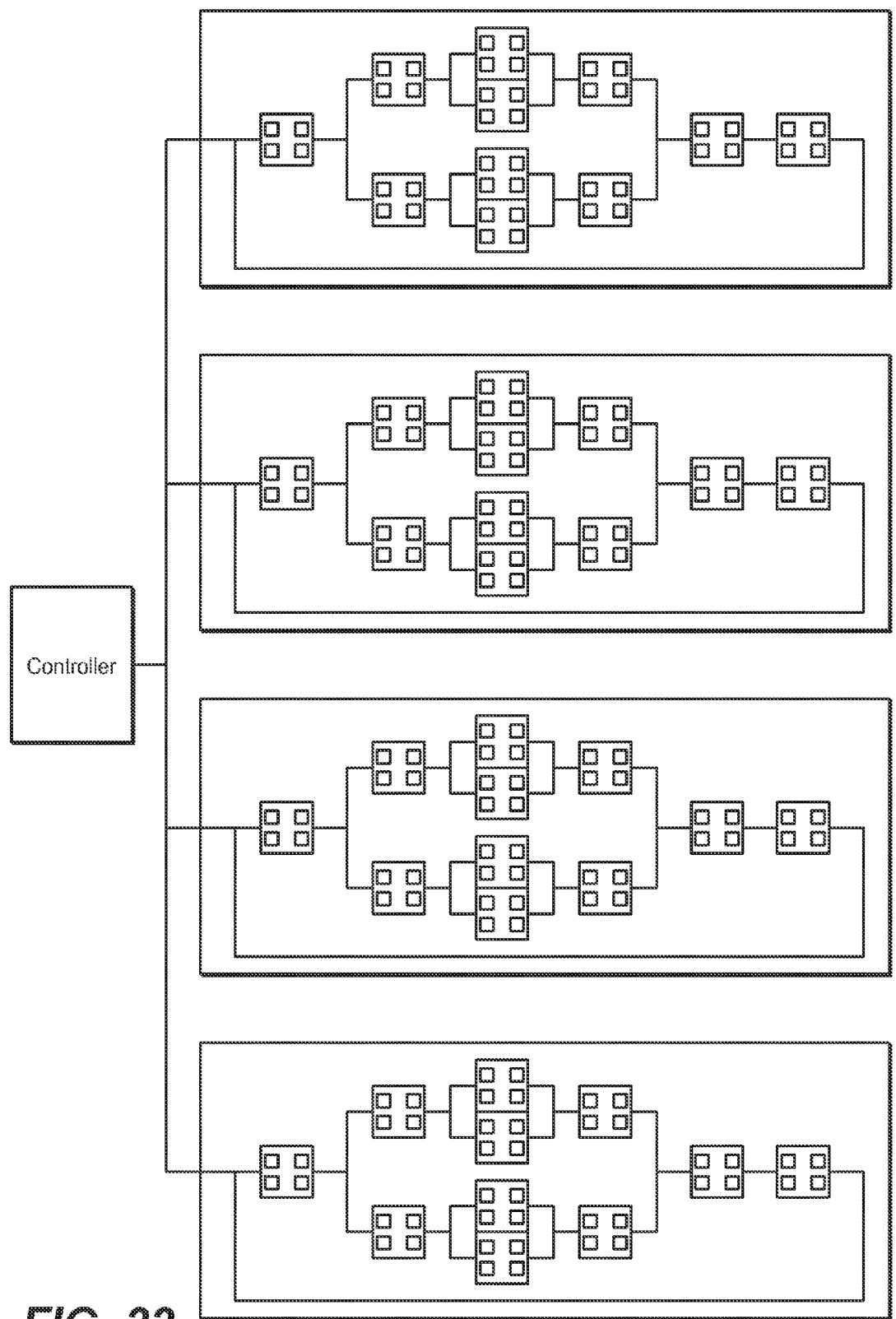
FIG. 22 illustrates an embodiment of a memory system of four 11-die packages connected to the same port

FIG. 22 illustrates an embodiment of a memory system of four 11-die packages as shown in FIG. 21 all connected to the same port: The fan-out is only 4 on the controller, but 2 inside package, so that maximum total fan-out is four. This results in 44 dies on the same channel, which, under the conventional arrangement of FIG. 1 would need a fan-out of 44.

Figure 23A:
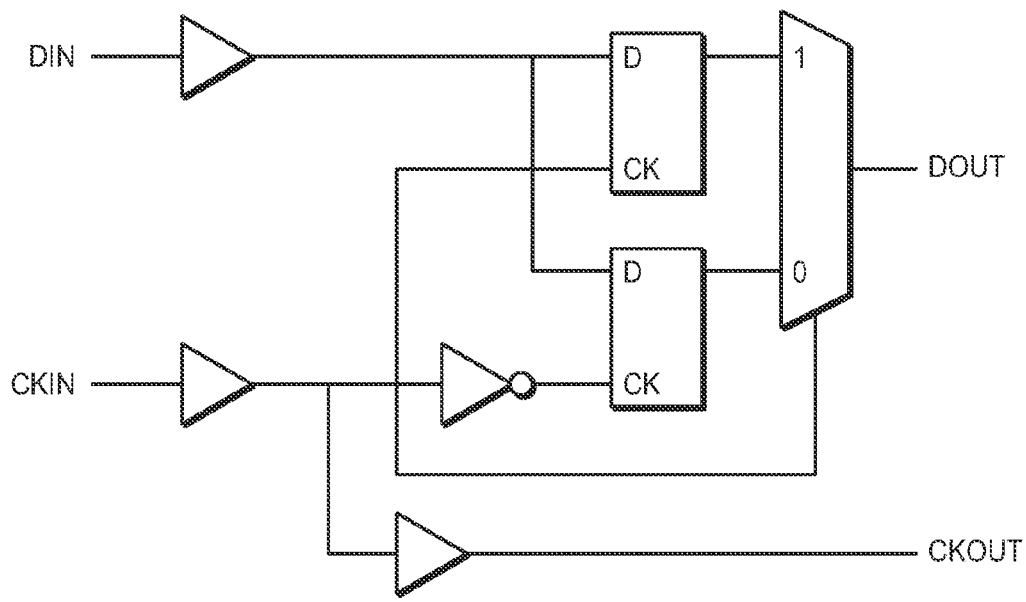
FIGS. 23A and 23B show two exemplary embodiments of circuits for data propagation with re-synchronization.
Figure 23B:
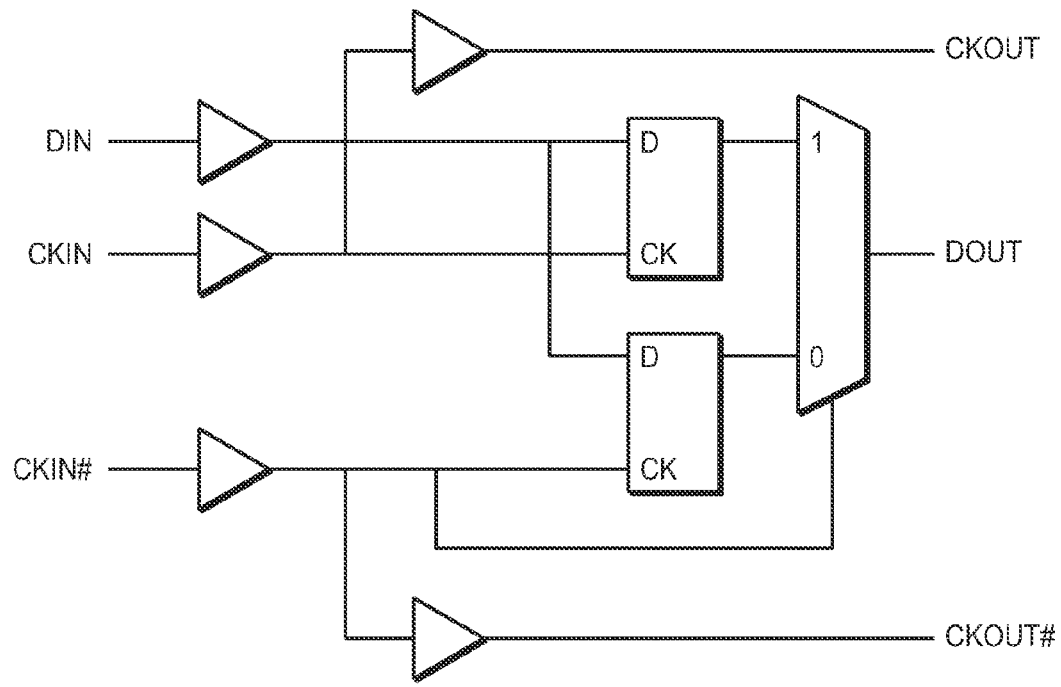

For any of these arrangements, as the signals travel through the branches to the different chips of the tree, the signals should preferably maintain a degree of synchronization. The re-synchronization can be done through a delay-tunable clock buffer arranged such that data are resynchronized. The delay elements, which were not explicitly shown in the earlier figures, can mostly be placed at the input and/or the output of the clock buffer. FIGS. 23A and 23B show two exemplary embodiments of circuits for data propagation with re-synchronization. Both circuits use a double data rate (DDR) arrangement, with data (DIN) and clock (CKIN) inputs and data (DOUT) and clock (CKOUT) outputs. The arrangement of circuit of FIG. 23B additionally includes an inverse for clock signal for propagating through the tree structure, where the inverse for the input and output clocks are shown at CKIN# and CKOUT#.

Figure 24:
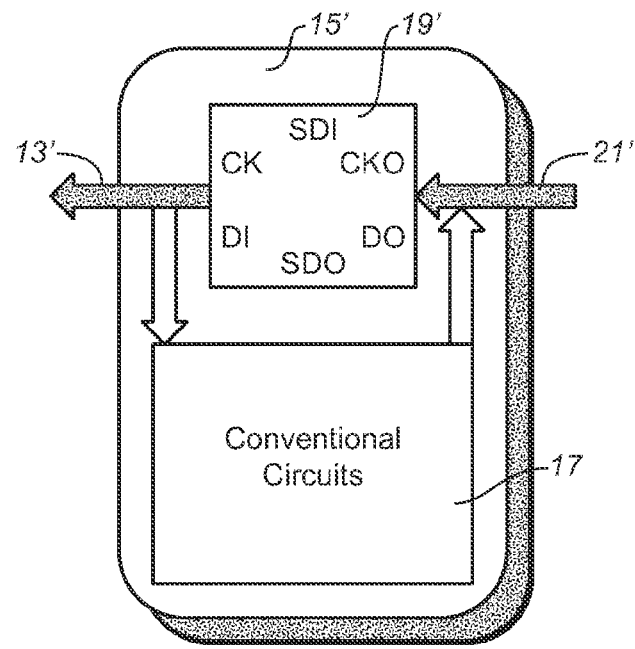
FIGS. 24 and 25 illustrates a pair of additional memory chip modes that can used in alternate embodiments.
Figure 25:
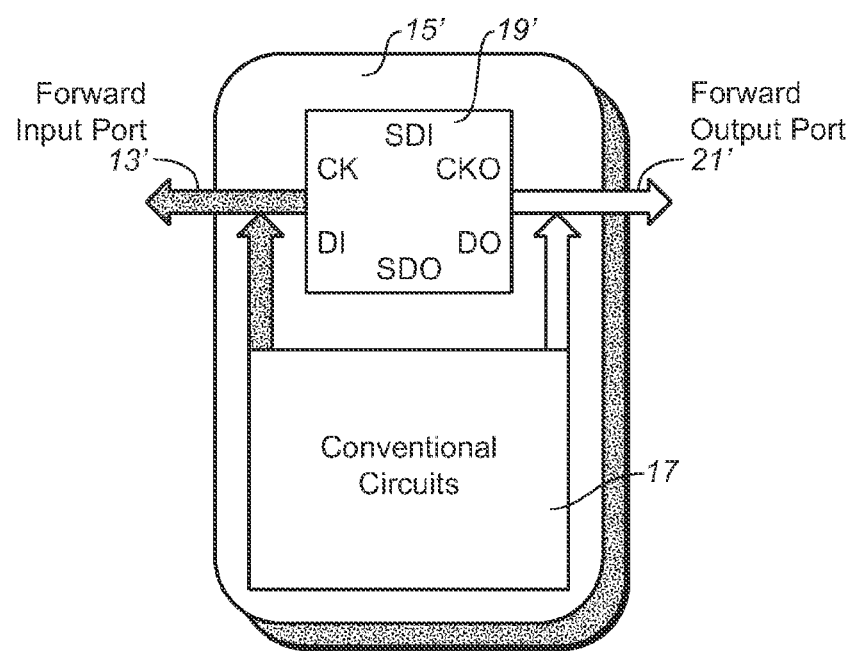
Figure 26:
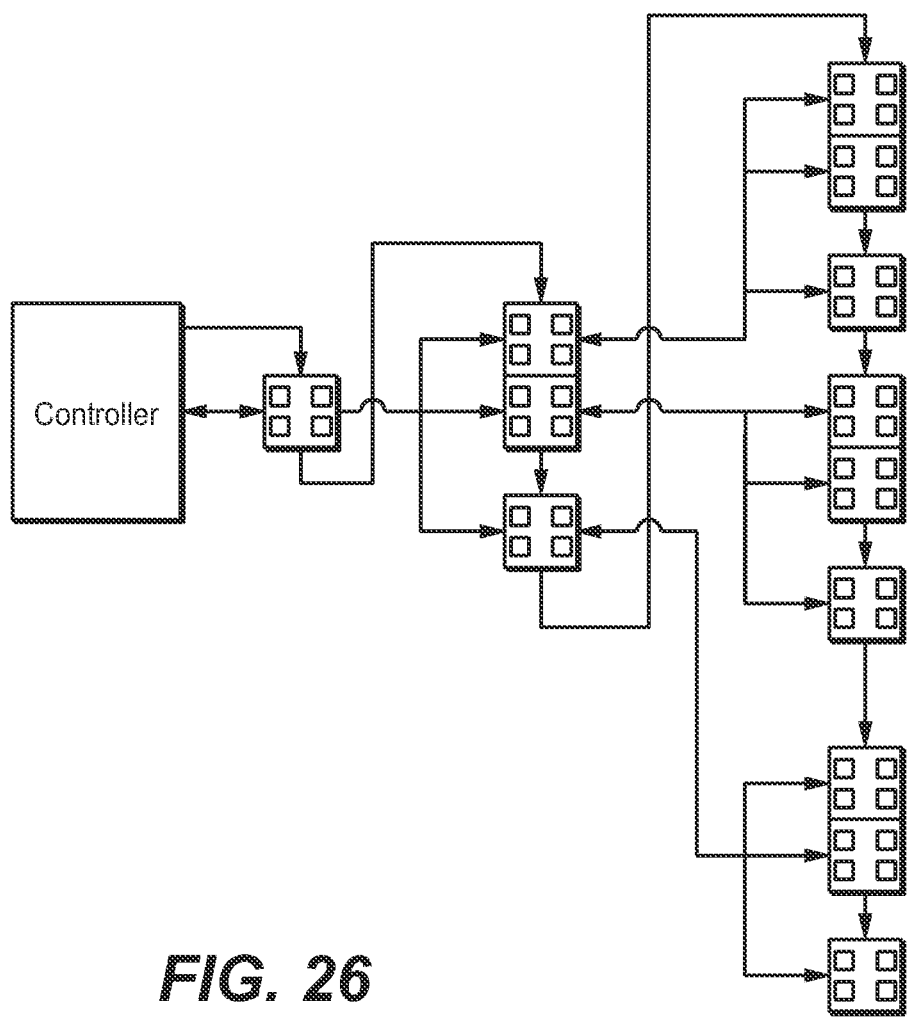
FIG. 26 shows an example of a topology using the modes of FIGS. 24 and 25.
Figure 27:
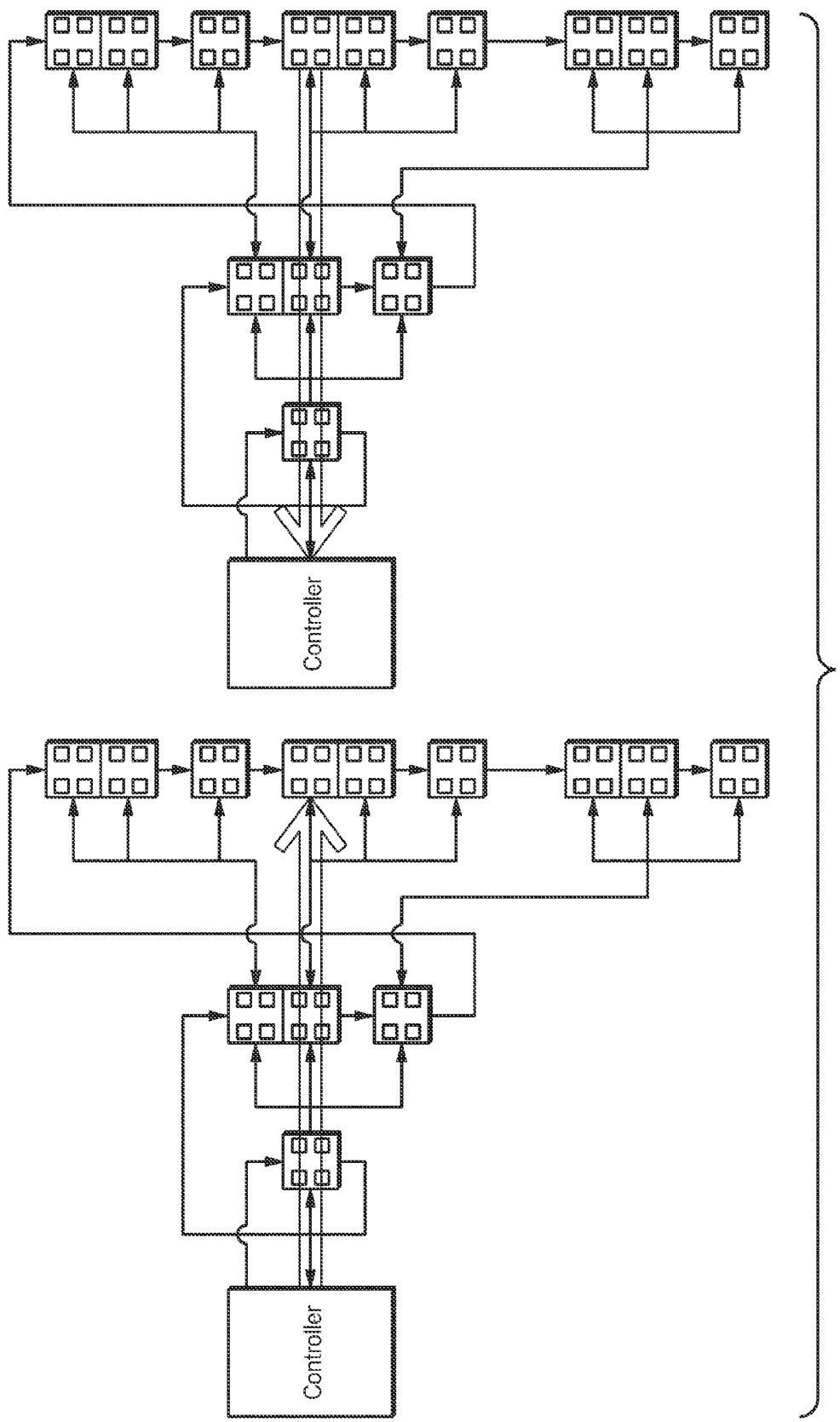
FIG. 27 illustrates the operation of FIG. 26.

FIGS. 24 and 25 illustrates a pair of additional memory chip modes that can used in alternate embodiments, with a corresponding exemplary topology shown in FIG. 26 whose operation is illustrate with respect to FIG. 27. Referring back to FIGS. 4-6, these illustrate a standby mode, a pass-through mode, and an active mode. As described further above, in the pass-through mode, address/commands and data are passed from the input bus 13 to the output bus 21, while the primary circuit section 17 is inactive; and in the active mode, addresses and commands can pass, but the primary circuit section is active where data does not pass, either coming in from the input bus 13 into primary circuit section 17, or out from the primary circuit section 17 on to the output bus 21. In FIGS. 24 and 25, the chip is modified to additionally, or alternately, include a reverse-pass though mode and a reverse active mode. In FIGS. 24 and 25, the corresponding elements are numbered the same as in FIGS. 4-6, but where the primes have been added as the elements 13', 21', and 19' also although a reverse flow, with the input 13' now also can have an output function and conversely for the output 21'.

More specifically, FIG. 24 illustrates a reverse pass-through mode. As with (forward) pass-through mode, the primary circuit section 17 can again be inactive. Data is again passed through, but now in the reverse direction, from the second input/output port connected at 21', clocked through the flip-flop 19' in the reverse direction, and out the first I/O port connected at 13'. In the exemplary embodiment, there is not a need to pass addresses and commands in the reverse direction.

FIG. 25 illustrates a reverse active mode, where, as with the (forward) active mode, the circuit portion 17 is again active, but data is output from the memory via the first I/O part 13', which was only used for input in the (forward) active mode. As with the reverse pass-through mode, there is not a need to pass addresses and commands in the reverse direction. As the reverse-active mode allows for the data to be output from the first I/O node 13', depending on the arrangement of the chips within the memory system, there may no longer be the need to for data also to output at the second I/O port 21'. (This is the case for the arrangements described below with respect to FIGS. 26 and 27.) Consequently, there is not a need for the (forward) active mode to be able to output data at the second I/O port 21', so functionality can be omitted, in which case the active and reverse active modes can be considered as the input and output phases of an active mode. As with the selection of a more traditional or the modes of FIGS. 4-6, the selection of the reverse modes instead of, or in addition to, the arrangements where data goes out the second I/O port can be based on a ROM fuse, a command or commands, a level on one or more pads, and so on.

The inclusion of the reverse modes allows additional topologies to be used. The topologies discussed above mainly looked at the case of a tree like structure where the chips fanned out from a single initial chip, then fanned back down to a final chip and data went in one side (the chip's input bus) and out the other (output bus) as illustrated schematically as a left to right flow in the figures. With the reverse modes, the memory devices can again be structured to fan out in a tree structure, but need not fan back in, where data can be sent back out in the reverse direction to the same "trunk" device, and then out to the controller or host. This is illustrated with respect to FIGS. 26 and 27.

FIG. 26 illustrates an embodiment with a fan out of 3 from each memory device and can be compared to FIG. 8: In both of FIGS. 26 and 8, the outputs of each memory device is connected to the input of 3 additional memory devices for three levels; however, they differ in that FIG. 8 fans back to the final chip, whose output then loops back to the controller. In contrast, FIG. 8 lacks these last two levels of FIG. 8. (As with the earlier figures of this type, FIG. 8 is meant to illustrate the topology of the devices connections, not their actual physical arrangement.) Instead, by adding the two reverse modes, commands and addresses will again flow from controller to the last devices in the last tier, with input data flowing in a similar way; but output data will flow back through the same path as the input data except in the reverse direction, as illustrated schematically in FIG. 27.

The top part of FIG. 27 shows an example of the flow of data and commands for a channel from the controller out to a selected device in the third tier, again based on the addresses and through the use of the serial connections, as illustrated by the large arrow. The lower part of FIG. 27 similarly illustrates the flow of data and responses back to the controller. By using the reverse modes, there is no longer the use of a feedback path as data output from the memory devices flows back the same path as for the input data, effectively reducing the loading on the controller path by half. Under the type of topology illustrated the by FIG. 26 using the reverse modes, because data output from memory devices flows through the same path as data input, there is no need to have the any memory devices receiving input from multiple devices to provide small fan-out to the controller. This allows for a constant fan-out throughout the network, maintaining similar signal integrity throughout the whole network.

For any of the embodiments discussed above, the tree like arrangement can have significant advantages over the more common arrangement illustrated with respect to FIG. 1. In particular, the load stays low and uniform even when large numbers of dies are used on a channel: for example, although the load increases linearly with the number of die for the arrangement of FIG. 1, the tree-like structure presented here has a largely constant load based on the degree of fan out, so that if the number of die in the channel were, say, 200, the worst case load is only a few die rather than the full 200. This can lead to higher performance and allow the use of high clock rates. Although the data and commands may need to propagate through a few tiers to get to a selected device, this only a minor performance penalty as, in addition to higher clock rates, a large degree of parallelism and pipelining can be used in the tree-like structure. Additionally, the use of the tree structure and the ability to put to sleep non-selected devices (as described above with respect to FIGS. 9 and 10) can significantly reduce power consumption of a channel.

A further advantage of the tree-like relates to how defective chips can be handled. Defects will largely occur in the primary circuit portion, rather than more basic circuitry of the interface's flip-flop. If a chip is found to be defective during operation, as long as the DFF portion of the circuit can pass signals, the chips that fan out, the device can be placed into stand-by mode and mapped out. Additionally, under this arrangement, testing procedures can be simplified as the primary circuit portion need not be tested since due to the available high degree of redundancy, any chips that turn out to be defective can just be treated the same devices that fail during later operation by being put into a permanent standby mode.

The preceding material is developed further in U.S. patent application Ser. Nos. 13/904,759 and 13/904,770, both filed May 29, 2013.

Addressing, Auto Address Assignment and Auto-Routing

This section presents a scheme for chips in the network to turn on and off their by-pass mode when the address of chip is broadcast to the network. The path to that chip from controller is automatically created. This can reduce cost and improve yield for NAND die, package, and system board. The auto-path arrangement off-loads from the controller the tasks of determining and setting up the paths for data and commands.

Figure 28:
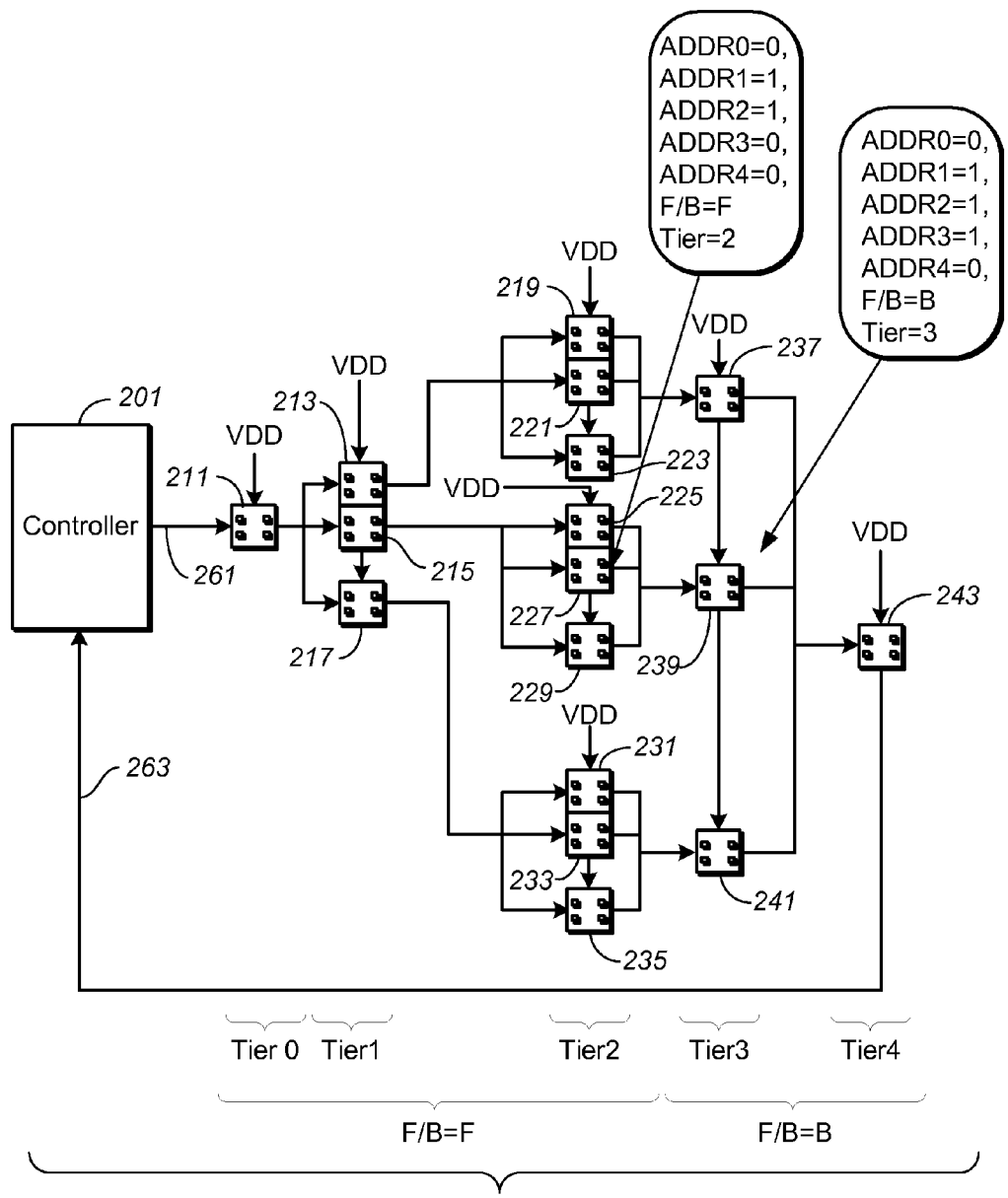
FIG. 28 corresponds to FIG. 8 for an alternate addressing arrangement.

FIG. 28 is presents a NAND memory system topology of five tiers arranged symmetrically with a branching ratio of three, both when branching out and back in. This arrangement is similar to that of FIG. 8 and elements are similarly numbered. FIG. 28 differs from FIG. 8 in the absence of the serial line, with the connection to the supply level VDD now explicitly shown instead. The memory chips are addressed using an on-chip address register and an addressing arrangement that is described with respect to FIGS. 29 and 30.

Figure 29:
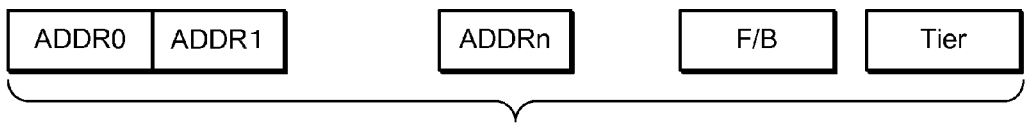
FIG. 29 is an exemplary embodiment for on-chip address register assignments.

FIG. 29 illustrates an exemplary embodiment of an on-chip address register. Here "ADDRi" is the address within the tier i. For example, the second chip on tier 1 (215) has ADDR1=1 h. ADDR1, ADDR2, . . . , ADDRn are defaulted to 0 h and then set to indicate the branch taken at each tier. The "F/B" value is a flag that indicates that Fan-in is one or more than one, corresponding to whether the chip is in the front (fanning out) or back (fanning back in) part of the tree structure, as indicated along the bottom of FIG. 28. The "Tier" value is the tier number of the addressed chip. For example, for chip 227 the path lead through chip 211 (chip 0 of tier 0) and chip 215 (chip 1), then to 227 (chip 1 of the chips that branch from 215). Consequently, ADDR0=1, ADDR1=ADDR2-1, and ADDR3 and ADDR4 are left at the default value of 0. Chip 227 is in the front portion (F/B=F) and in tier 2. Consequently, the full address is as shown in FIG. 28.

The address for chip 239 is also shown in FIG. 28 and ADDR0, ADDR1, and ADD2 are established in the same way as for chip 227. Now F/B=B and Tier=4. As chip 239 is in the back part of the tree structure, ADDR3 and ADDR4 can be establish by working backward from tier 5 to tier 4, giving ADDR3=1 and ADDR=0. The address of chip 239 is then as shown in FIG. 28.

Figure 30:
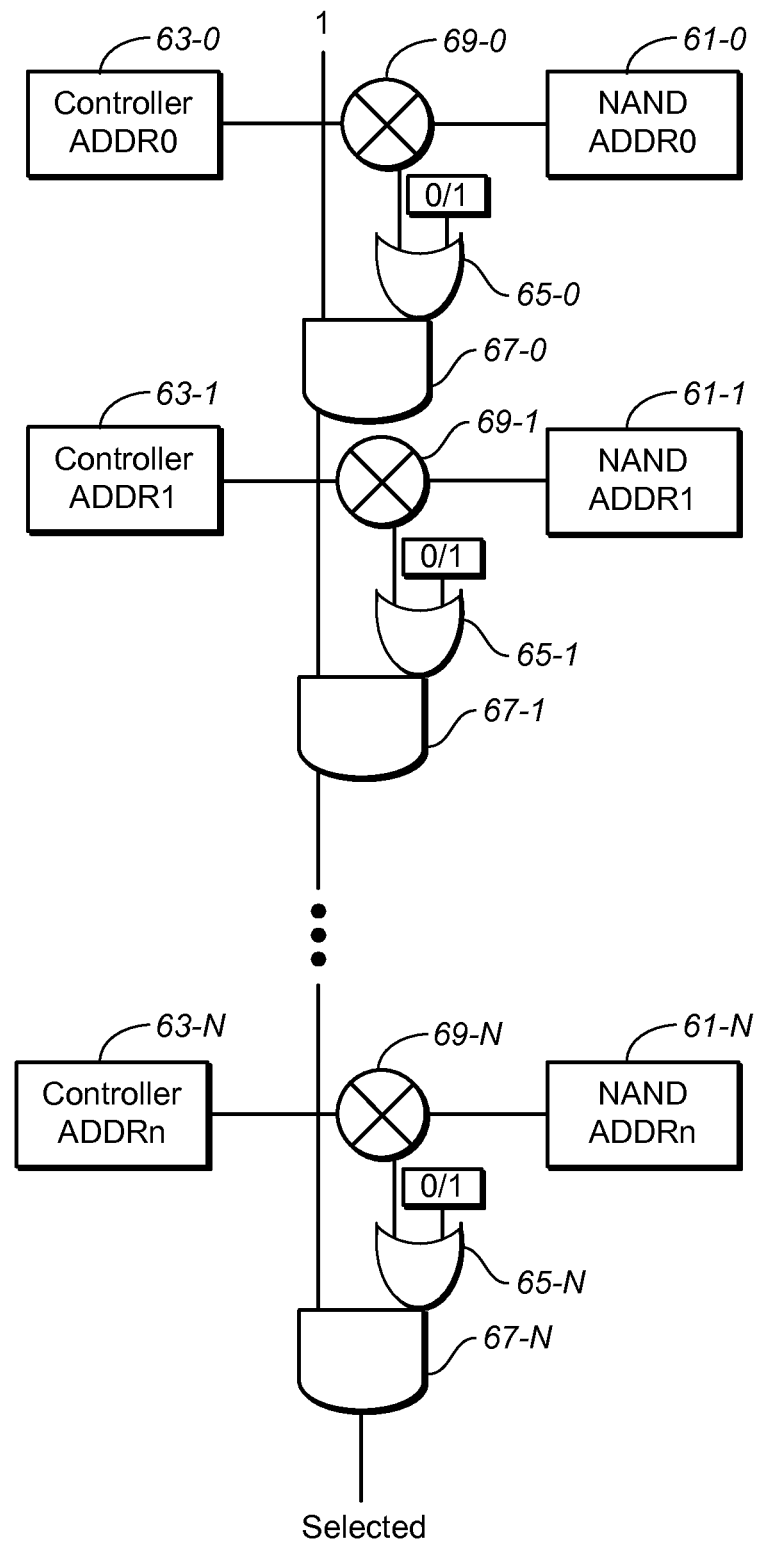
FIG. 30 illustrates an example of address selection circuitry.

With respect to an exemplary set of rules for addressing and chip selection, the controller issues a chip address that consists of all of tier addresses that correspond to the ADDR0, . . . , ADDn registers. A chip is being addressed if and only if all of tier sub-address from controller match those of the chip, where the chip ignores tier addresses for tiers higher than its own tier. FIG. 30 illustrates an exemplary circuit for the purpose. Along the left side are the register values ADDRi 61-$i$ as set on the memory chip, where these are compared at the XNOR gate 69-$i$ to the corresponding part of the address ADDRi 63-$i$ to see whether they match, with the result then input into the OR gate 65-$i$. The other input to the OR gate 65-$i$ is a bit generated from the tier number of the chip that determines which controller tier addresses are to be ignored. The OR gate 65-$i$ then is one of the inputs to the AND gate 67-$i$, where the other input is the output of the preceding AND gate in the series. The input of the first AND gate 67-0 is set to 1 and the output of the last AND gate 67-N determines whether the chip is selected.

An address assignment process can assign values to address related register, were an exemplary embodiment includes: Tier discovery; Intra-tier address discovery; Midpoint tier broadcast; and Intra-tier address propagation. Tier discovery is a scheme to enable each chip to find its tier number and assign its value to the tier register. Intra-tier address discovery is a scheme for a chip to find its local address within tier. A mid-point tier broadcast provides a mid-point tier number that is the tier number for the tier whose next tier can have fan-in of more than one. Intra-tier address propagation propagates the local address of all the chip's ancestors with fan-in value of 0 to the descendant's ADDRi register. These register values can either be held in a volatile register, in non-volatile memory, or both. In the case of only volatile register values being used, the process would need to be repeated at power up. Note that this arrangement allows for all of the chips to be the same (or at least without pre-assigned addresses), as the address values can be set once the system is packaged. This arrangement also ready allows for any defective chips to be (logically) addressed out of the system.

Considering the tier discovery process, each chip can have a temporary register, Rtemp. The address assignment process assigns values to address related register and can include the controller issuing a command to reset all Rtemp values to 0. The controller then issues data of all 1s to data bus consecutively for a number of clock cycles that is more than the maximum tier count in the system. Each chip latches the data receives in Rtemp and outputs this value of Rtmp to the chips of the next tier. Each chip can count number of clock cycles it takes to receive a 1. This number of cycles is the tier number. This process is illustrate in FIG. 31 for the system of FIG. 28, starting with all of the Rtemp values set to 0 for all of the chips of the array at the first of the system figures. The data values 1 are then propagated through the system, as illustrated in subsequent figures, until all of the Rtemp values are 1. Then, as illustrated in the last figure of FIG. 31, the Tier register value is set according to the number of clock cycles for the chip to receive a 1.

Figure 31:
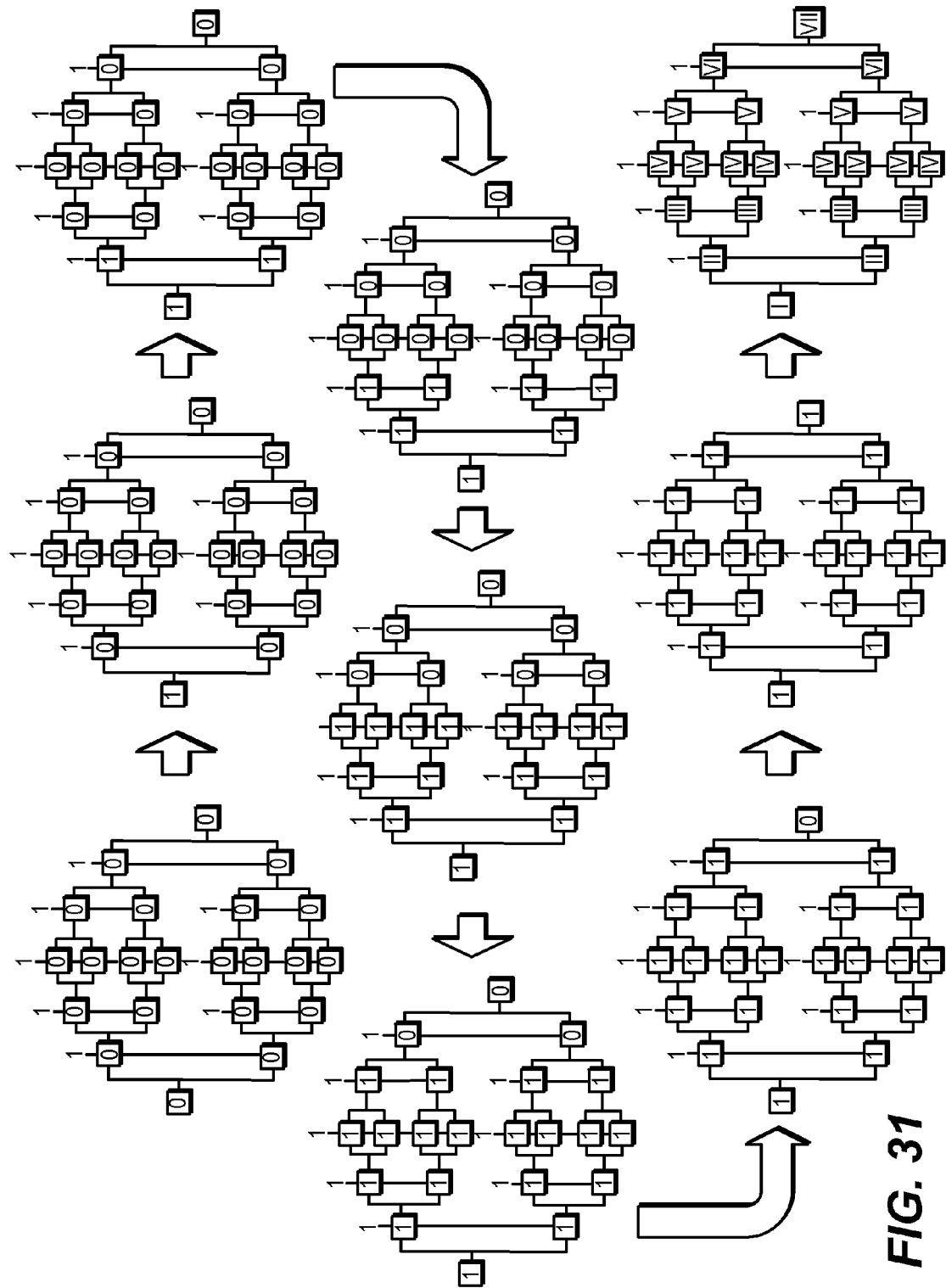
FIG. 31 illustrates a tier discovery process.
Figure 32:
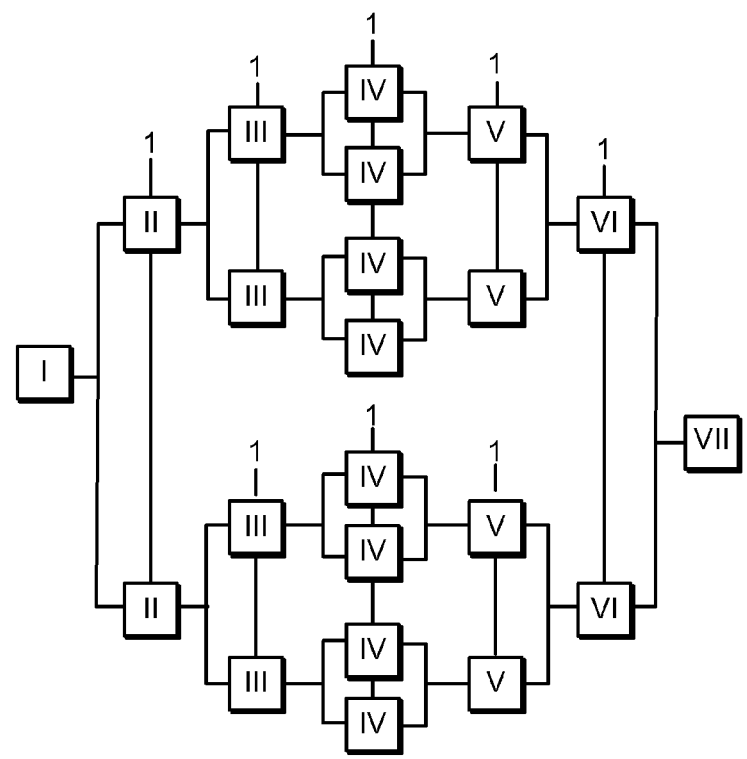
FIG. 32 illustrates the mid-tier broadcast number.

In the mid-tier number broadcast, the controller broadcast the mid-tier number to all chips in the channel. In FIG. 31, the mid-tier number is three. In the network of FIG. 32, the mid-tier number is 4. In the exemplary embodiment, the mid-tier number is an important value. Each chip compare its tier number based on the mid-tier number to determine whether it is in the front side of the tree or the back side of the tree. This is used to set the F/B value and to determine which addresses it needs to compare and to turn on and off the path from the controller to the chip itself.

Figure 33:
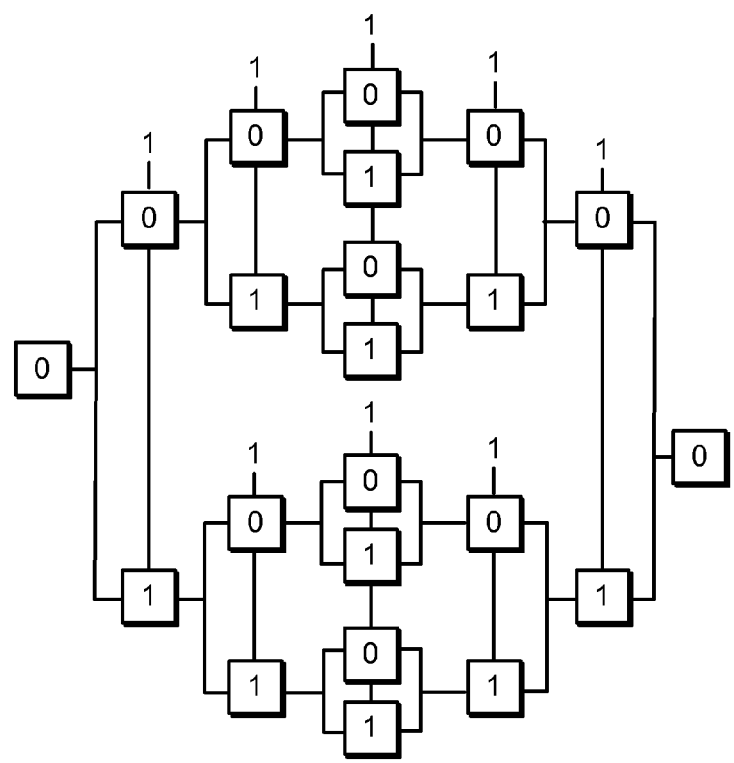
FIG. 33 illustrates intra-tier discovery.

FIG. 33 looks at intra-tier address discovery for the 7 tier system with a fan out/fan in of two. Each chip will store the intra-tier address of all of its ancestors as these branch out, branch in. For chips at the front side, the intra-tier address propagates from ancestors down to the descendants, with each of the descendants catching the address and storing it in its sub-address register. For front side chips, the intra-tier address registers for the tier after the middle tier can be left at their default 0 value. For chips on the back side, the chips receive and put into the sub-address registers the value of all sub-address registers of the chips up to mid-tier as with the front side, while the sub-address for tiers in the back-side are determined by how the back side chips fan out in the reverse direction from the last tier. This is results in the front-back symmetry of the intra-tier addresses of the chips as shown in FIG. 33. The full address for examples of a front and back chip for the embodiment of FIG. 28 is then shown there for the chips 227 and 239. For both of these, the ADDR0-2 are the same, while for chip 239 ADDR3=1 as it is in the second branch going backward from chip 243 (the ADDR4=0 chip of tier 4).

With respect to data passing in the tree structure, for data input a chip will be in a by-pass mode if and only if all its sub-addresses are part the full designated address. For data output, for a front side chip, the chip will be in by-pass mode if and only if the designated address is part of this chip's address path. For data output for back side chips, if the designated chip is also on the back side, then the chip will be in by-pass mode if and only if designated address is part of this chip's address path. For data output for back side chips when the designated chip is on the front side, this chip will be in by-pass mode if and only if the "truncated designated address" is part of this chip's address path. (A "truncated designated address" here means removing addresses of the tiers in the front side with the same distance to the mid-tier as this chip, and removing all back-tier address; for example, with mid-tier at 4 and the chip is at tier 6, then front side chip's truncated address would be removing all addresses except tier 1 and 2.)

Figure 6:
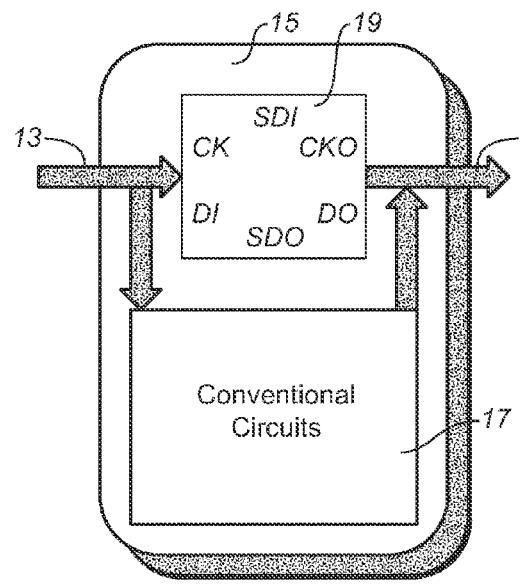

Above, with respect to FIGS. 4-6, three modes of memory chip operation were discussed. These included a standby mode (FIG. 4), where addresses/commands are passed, data is not passed, and the "conventional circuits" 17 are not active; a register pass through mode (FIG. 5), where addresses/commands are passed, data is passed, and the "conventional circuits" 17 are not active; and an active mode (FIG. 6), where addresses/commands are passed, data is not passed, and the "conventional circuits" 17 are active.

Figure 34:
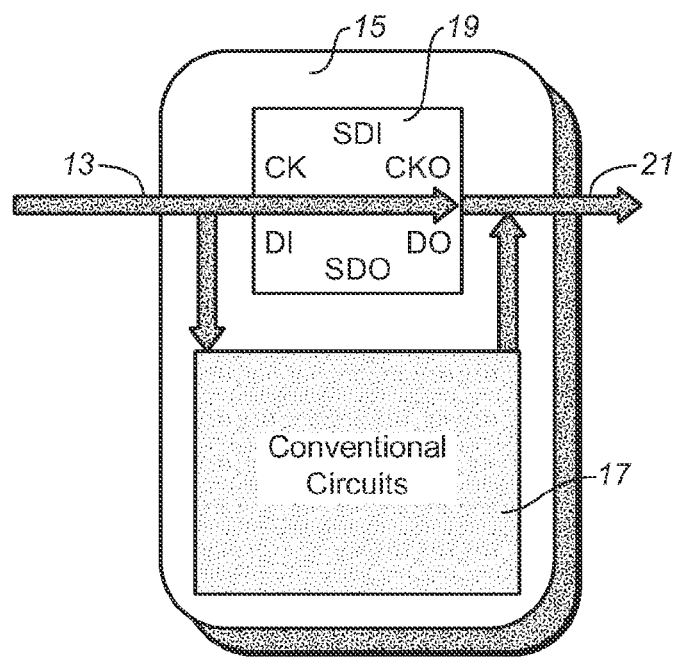
FIGS. 34 and 35 respectively illustrate a combinatorial pass through mode and a combinatorial reverse pass through mode.

In the register pass through of FIG. 5, Addresses and commands, the data and addresses/commands are clocked through the chip from the input bus 13 to the output bus 21. The memory chips can also operate in an alternate pass through phase, a combinational pass through mode. FIG. 34 illustrates the combinational pass through mode. As with the register pass through mode, addresses/commands are passed, data is passed, and the "conventional circuits" 17 are not active. Unlike the register pass through mode, in the combinational pass through mode data and addresses/commands pass from the input bus 13 to the output bus 21 without being clocked by the flip-flop 19, as illustrated schematically by the arrow through the flip-flop 19. This allows for the option of commands and data to pass directly through bypassed chips without a clock delay when this is not needed or desired, so that any intervening chips to some extent become transparent.

Figure 35:
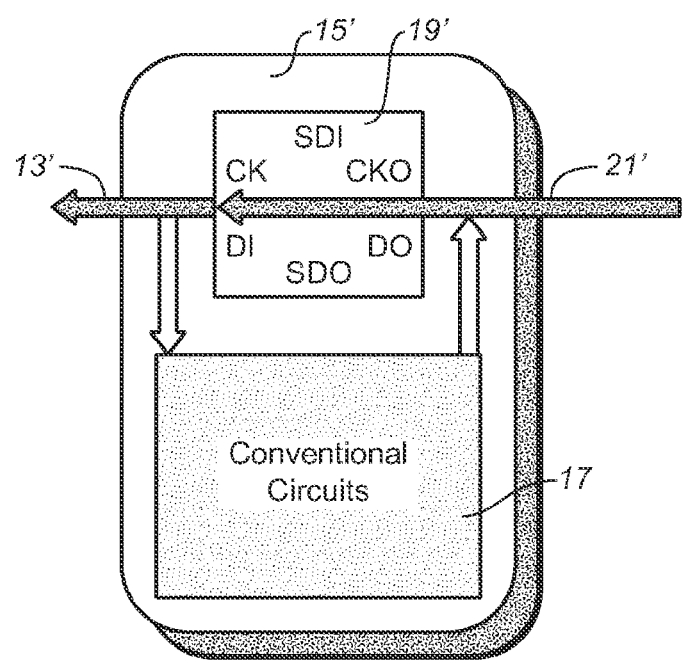

Similarly, with respect to the reverse modes, in addition to the reverse active mode of FIG. 25 and the register reverse pass through mode of FIG. 24, data is clocked through the flip-flop in the reverse direction, there can also be an alternate combinatorial pass through mode. This is illustrated in FIG. 35. In the combinatorial pass through mode, data again passes through in the reverse direction, but without being clocked through the flip-flop 19', as indicated by the arrow passing it. For either of the pass through modes, the conventional circuit portion 17 is not active and the passing of addresses or commands is not applicable.

Figure 36:
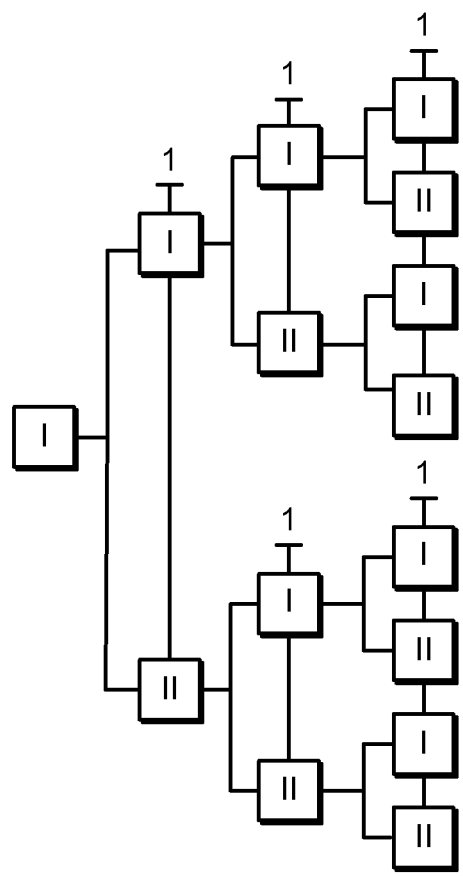
FIG. 36 corresponds to FIG. 26 for the alternate addressing arrangement.

As with FIGS. 26 and 27, the addressing scheme of this section can also be applied to a tree structure that only branches out by use of the reverse modes of the memory circuits. This is illustrated in FIG. 36, which is a 4-tier arrangement with a bracing ratio of 2. Relative to FIGS. 26 and 27, and similar to the discussion of FIG. 28 above, FIG. 36 also differs in the lack of a serial line, with the VDD connection now explicitly shown. The application of the addressing scheme of this section can be applied to the I/O tree of FIG. 36, which can reduce some of the complexities involved as there is only front side of the structure.

CONCLUSION

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. A non-volatile memory system comprising:
a memory section including:
a plurality of non-volatile memory circuits each having a first set of bus connections and a second set of bus connections; and
a bus structure connecting the plurality of non-volatile memory circuits in a tree-type arrangement that includes a front section and a back section,
wherein the front section comprises a series of multiple tiers in which each subsequent tier in the series has a higher number of memory circuits than a preceding tier with a last tier having the highest number of memory circuits,
wherein, for each tier except the last tier in the series, the second set of bus connections of memory circuits in each tier in the series branches out and connects to the first set of bus connections of one or more memory circuits of a subsequent tier in the series,
wherein the first set of bus connections of the one or more memory circuits in a first tier in the series connects to an input bus section,
wherein the back section comprises at least one tier with the same number of memory circuits as the tier preceding the last tier in the series from the front section; and
wherein the second set of bus connections of one or more memory circuits of the last tier of the back section connects to an output bus section; and
a controller circuit connected to the input bus section and to the output bus section, wherein the controller circuit is configured to determine a tier address for each of the memory circuits by propagating a signal from the input bus section through all the series of tiers according to a first clock, wherein the tier address is determined based on a number of cycles of the first clock required for the signal to propagate to a corresponding memory circuit.

2. The non-volatile memory system of claim 1, wherein at least one of the memory circuits in one or more tiers in the series preceding the tier of an addressed memory circuit and that are in a path of the bus structure between the input bus section and the addressed memory circuit pass commands and data from the controller circuit to the tier of the addressed memory circuit.

3. The non-volatile memory system of claim 1, wherein at least one of the memory circuits in one or more tiers in the series preceding the tier of an addressed memory circuit and that are in the path of the bus structure between the input bus section and the addressed memory circuit pass commands and data based on the tier address.

4. The non-volatile memory system of claim 1, wherein at least one of the memory circuits in one or more tiers in the series preceding the tier of an addressed memory circuit and that are in the path of the bus structure between the input bus section and the addressed memory circuit pass commands and data according to a clock signal.

5. The non-volatile memory system of claim 1, wherein the number of memory circuits in the first tier in the series from the front section is one.

6. The non-volatile memory system of claim 1, wherein at least one of the memory circuits in each tier, except the last tier, in the series from the front section branches out into the same number of memory circuits as the memory circuits in a subsequent tier in the series.

7. The non-volatile memory system of claim 1, wherein the second set of bus connections of one or more memory circuits in the at least one tier from the back section is connected to an output bus section, and wherein the output bus section connects to the controller circuit.

8. The non-volatile memory system of claim 1, wherein the tree-type arrangement is symmetric with respect to the front section and the back section and has a common branching ratio.

9. The non-volatile memory system of claim 1, wherein the controller circuit addresses the memory circuits via the input bus section and receives data from the memory circuits via the output bus section.

10. The non-volatile memory system of claim 1, wherein, in response to addressing a memory circuit in the series, the controller circuit sets one or more of the memory circuits in one or more tiers in the series preceding the tier of the addressed memory circuit in a pass-through mode of operation or a sleep mode of operation.

11. The non-volatile memory system of claim 1, wherein the controller circuit is configured to determine an intra-tier sub-address for each of the memory circuits by sequentially propagating a signal within each set of memory circuits branching out from a common memory circuit in the preceding tier according to a second clock, wherein the intra-tier address is determined based upon a number of cycles of the second clock required for the signal to propagate to a corresponding memory circuit.

12. A method of operating a non-volatile memory system, comprising:
assigning addresses to a plurality of memory circuits of the non-volatile memory system, wherein the memory circuits each have a first set of bus connections and a second set of bus connections and are connected by a bus structure in a tree-type arrangement that includes a front section, the front section having a series of multiple tiers of memory circuits in which, for each tier except the last in the series of the front section, the second set of bus connections of the memory circuits in each tier branches out and connects to the first set of bus connections of a set of one or more memory circuits of a subsequent tier in the series, and wherein the first set of bus connections of the one or more memory circuits of a first tier in the series is connected to a corresponding branch from an input bus section, the assigning of addresses including:
determining a tier address for each of the memory circuits by propagating a signal from the input bus section through the series of tiers according to a first clock, wherein the tier address is determined based upon a number of cycles of the first clock required for the signal to propagate to a corresponding memory circuit;
determining an intra-tier sub-address for each of the memory circuits of the front section by sequentially propagating a signal within each set of memory circuits branching out from a common memory circuit in the preceding tier according to a second clock, wherein the intra-tier address is determined based upon a number of cycles of the second clock required for the signal to propagate to a corresponding memory circuit; and
assigning an address to each of the memory circuits according to:
the corresponding determined tier address;
the corresponding intra-tier sub-address; and
for the memory circuits of the front section, the intra-tier sub-addresses for each preceding tier of the front section identifying the corresponding branch to which the memory circuit belongs.

13. The method of claim 12, further comprising:
for each of the memory circuits, storing the corresponding assigned address in a register of the memory circuit.

14. The method of claim 13, wherein the corresponding assigned addresses are stored in non-volatile memory.

15. The method of claim 12, wherein the tree-type arrangement further includes a back section, the back section having a series of one or more tiers in which for each tier except the first tier in the series of the back section, the first set of bus connections of memory circuits in each tier branches in and connects to the second set of bus connections of a set one or more memory circuits of the preceding tier in the series of the back section, and where the second set of bus connections of the one of more memory circuits of the last tier in the series of the back section being connected to a corresponding branch from an output bus section, and wherein assigning addresses further includes:
determining an intra-tier sub-address for each of the memory circuits of the back section by sequentially propagating a signal within each set of memory circuits branching into a common memory circuit in the subsequent tier according to a third clock, wherein the intra-tier address is determined based upon a number of cycles of the third clock required for the signal to propagate to a corresponding memory circuit; and
addressing an address to each of the memory circuits further includes assigning the intra-tier sub-address for each preceding tier identifying the corresponding branch of the memory circuit.

16. The method of claim 15, further comprising:
Determining a front/back address for each of the memory circuits by comparing the tier number for each of the memory circuits to a received mid-tier number indicating a first tier midway in the series of multiple tiers and wherein the address for each of the memory circuits further includes a front/back address.

* * * * *